(12) United States Patent
Hsu et al.

(10) Patent No.: US 11,710,667 B2
(45) Date of Patent: Jul. 25, 2023

(54) GATE-ALL-AROUND DEVICE WITH TRIMMED CHANNEL AND DIPOLED DIELECTRIC LAYER AND METHODS OF FORMING THE SAME

(71) Applicant: Taiwan Semiconductor Manufacturing Co., Ltd., Hsin-Chu (TW)

(72) Inventors: Chung-Wei Hsu, Hsinchu (TW); Kuo-Cheng Chiang, Hsinchu County (TW); Kuan-Lun Cheng, Hsin-Chu (TW); Hou-Yu Chen, Hsinchu County (TW); Ching-Wei Tsai, Hsinchu (TW); Chih-Hao Wang, Hsinchu County (TW); Lung-Kun Chu, New Taipei (TW); Mao-Lin Huang, Hsinchu (TW); Jia-Ni Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/926,470

(22) Filed: Jul. 10, 2020

(65) Prior Publication Data
US 2021/0066137 A1    Mar. 4, 2021

Related U.S. Application Data

(60) Provisional application No. 62/892,076, filed on Aug. 27, 2019.

(51) Int. Cl.
*H01L 21/8238*    (2006.01)
*H01L 29/06*    (2006.01)
(Continued)

(52) U.S. Cl.
CPC ......... *H01L 21/823857* (2013.01); *H01L 21/02236* (2013.01); *H01L 21/02603* (2013.01);
(Continued)

(58) Field of Classification Search
CPC ............ H01L 21/28158; H01L 29/408; H01L 29/78696; H01L 21/31111; H01L 21/31144
See application file for complete search history.

(56) References Cited

U.S. PATENT DOCUMENTS 8,772,109 B2   7/2014 Colinge
8,785,285 B2   7/2014 Tsai et al.
(Continued)

*Primary Examiner* — Brian Turner
(74) *Attorney, Agent, or Firm* — Haynes and Boone, LLP

(57) ABSTRACT

Semiconductor device and the manufacturing method thereof are disclosed. An exemplary method comprises forming a first stack structure and a second stack structure in a first area over a substrate, wherein each of the stack structures includes semiconductor layers separated and stacked up; depositing a first interfacial layer around each of the semiconductor layers of the stack structures; depositing a gate dielectric layer around the first interfacial layer; forming a dipole oxide layer around the gate dielectric layer; removing the dipole oxide layer around the gate dielectric layer of the second stack structure; performing an annealing process to form a dipole gate dielectric layer for the first stack structure and a non-dipole gate dielectric layer for the second stack structure; and depositing a first gate electrode around the dipole gate dielectric layer of the first stack structure and the non-dipole gate dielectric layer of the second stack structure.

20 Claims, 20 Drawing Sheets

(51) Int. Cl.
  *H01L 29/423* (2006.01)
  *H01L 21/28* (2006.01)
  *H01L 29/66* (2006.01)
  *H01L 27/092* (2006.01)
  *H01L 29/49* (2006.01)
  *H01L 29/51* (2006.01)
  *H01L 29/786* (2006.01)
  *H01L 29/78* (2006.01)
  *H01L 21/02* (2006.01)
  *H01L 21/311* (2006.01)

(52) U.S. Cl.
  CPC .. *H01L 21/28185* (2013.01); *H01L 21/31111* (2013.01); *H01L 21/823807* (2013.01); *H01L 27/092* (2013.01); *H01L 29/0673* (2013.01); *H01L 29/42364* (2013.01); *H01L 29/42392* (2013.01); *H01L 29/4908* (2013.01); *H01L 29/516* (2013.01); *H01L 29/6684* (2013.01); *H01L 29/66742* (2013.01); *H01L 29/78391* (2014.09); *H01L 29/78696* (2013.01); *H01L 2029/42388* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,991,352 B1* | 6/2018 | Frougier | H01L 29/775 |
| 10,825,736 B1* | 11/2020 | Zhang | H01L 29/775 |
| 2018/0315667 A1* | 11/2018 | Kwon | H01L 29/4966 |
| 2019/0172751 A1* | 6/2019 | Smith | H01L 29/0673 |
| 2019/0371903 A1* | 12/2019 | Bao | H01L 21/02603 |
| 2020/0194569 A1* | 6/2020 | Wang | H01L 21/823807 |
| 2020/0279777 A1* | 9/2020 | Zhang | H01L 29/0673 |
| 2021/0013111 A1* | 1/2021 | Smith | H01L 21/823842 |

* cited by examiner

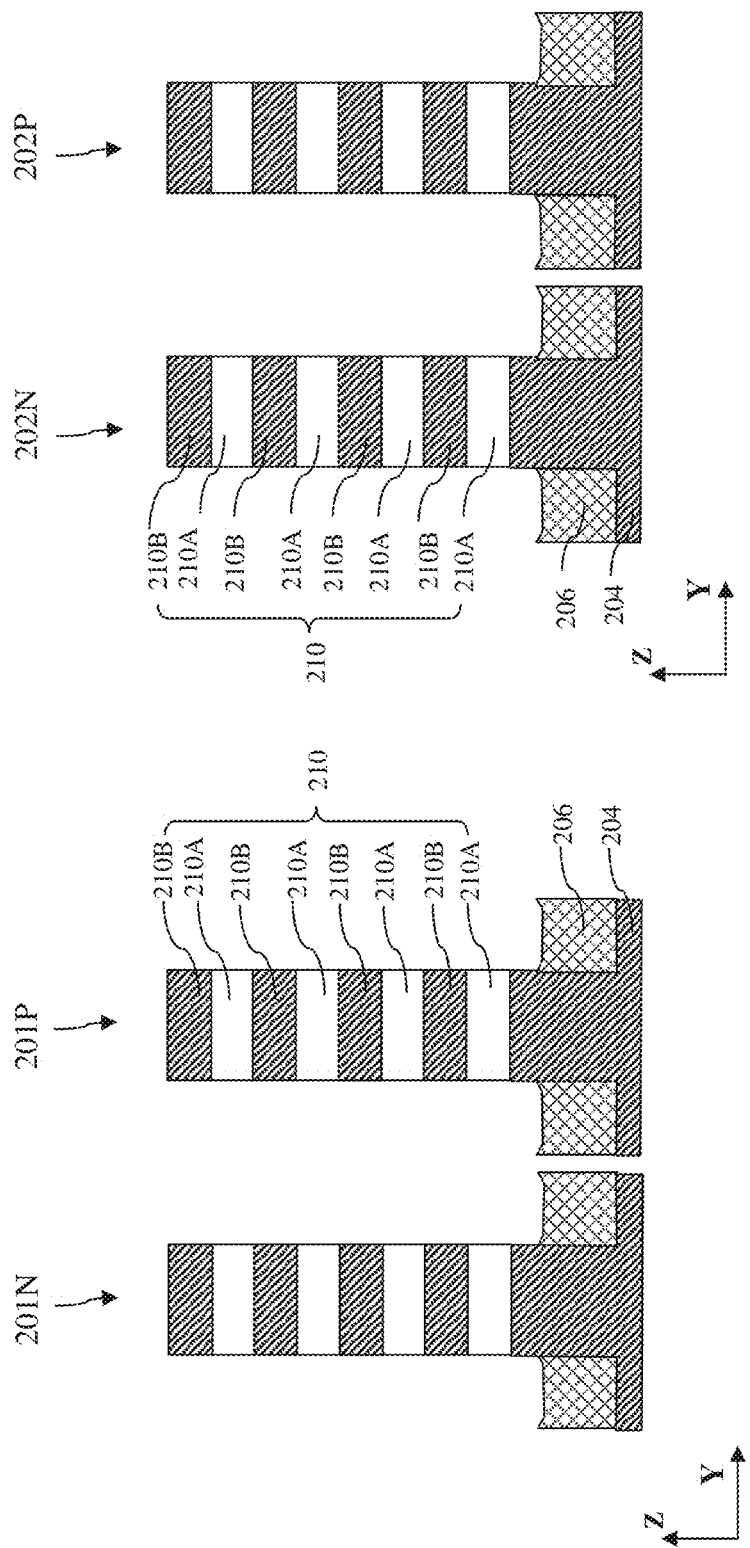

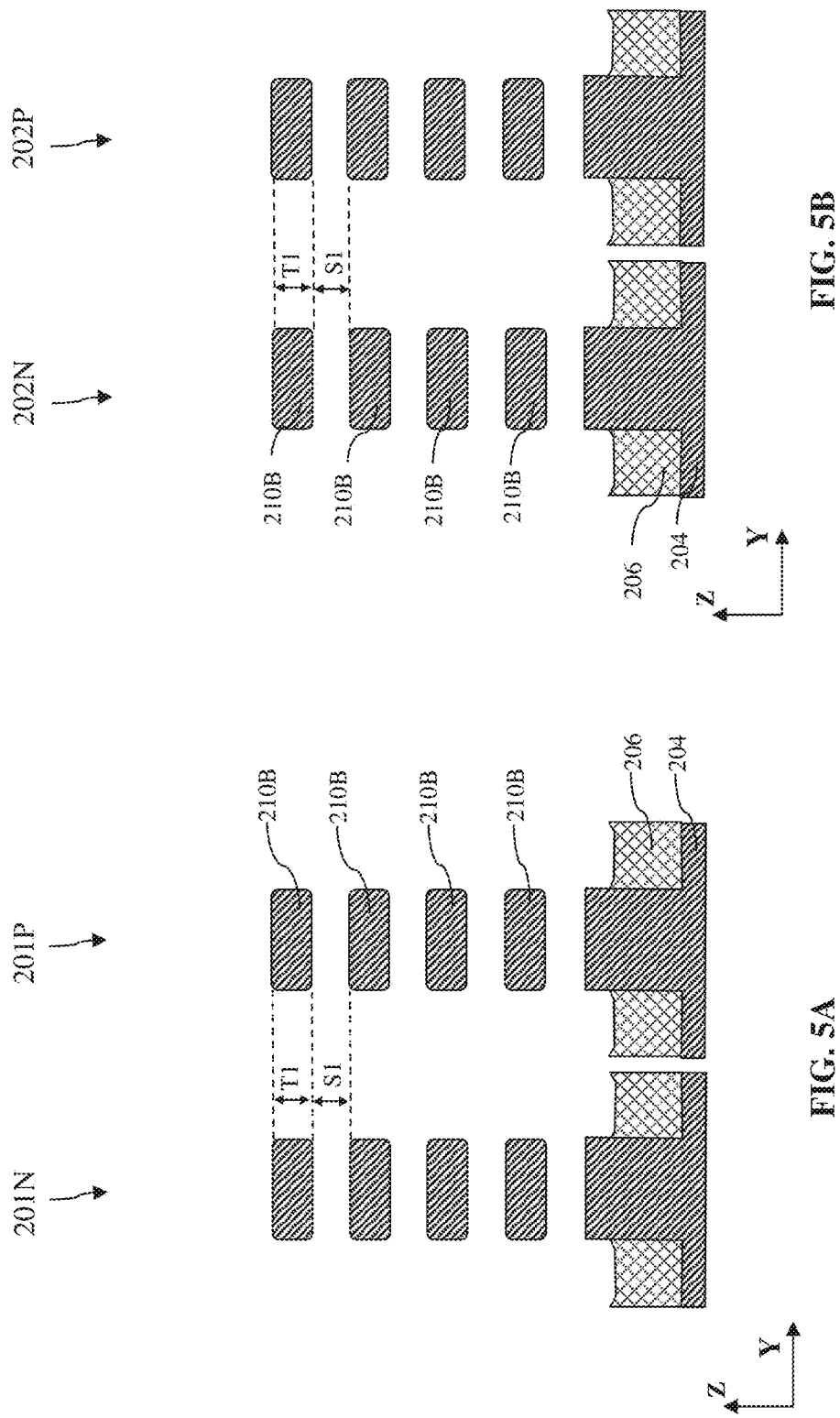

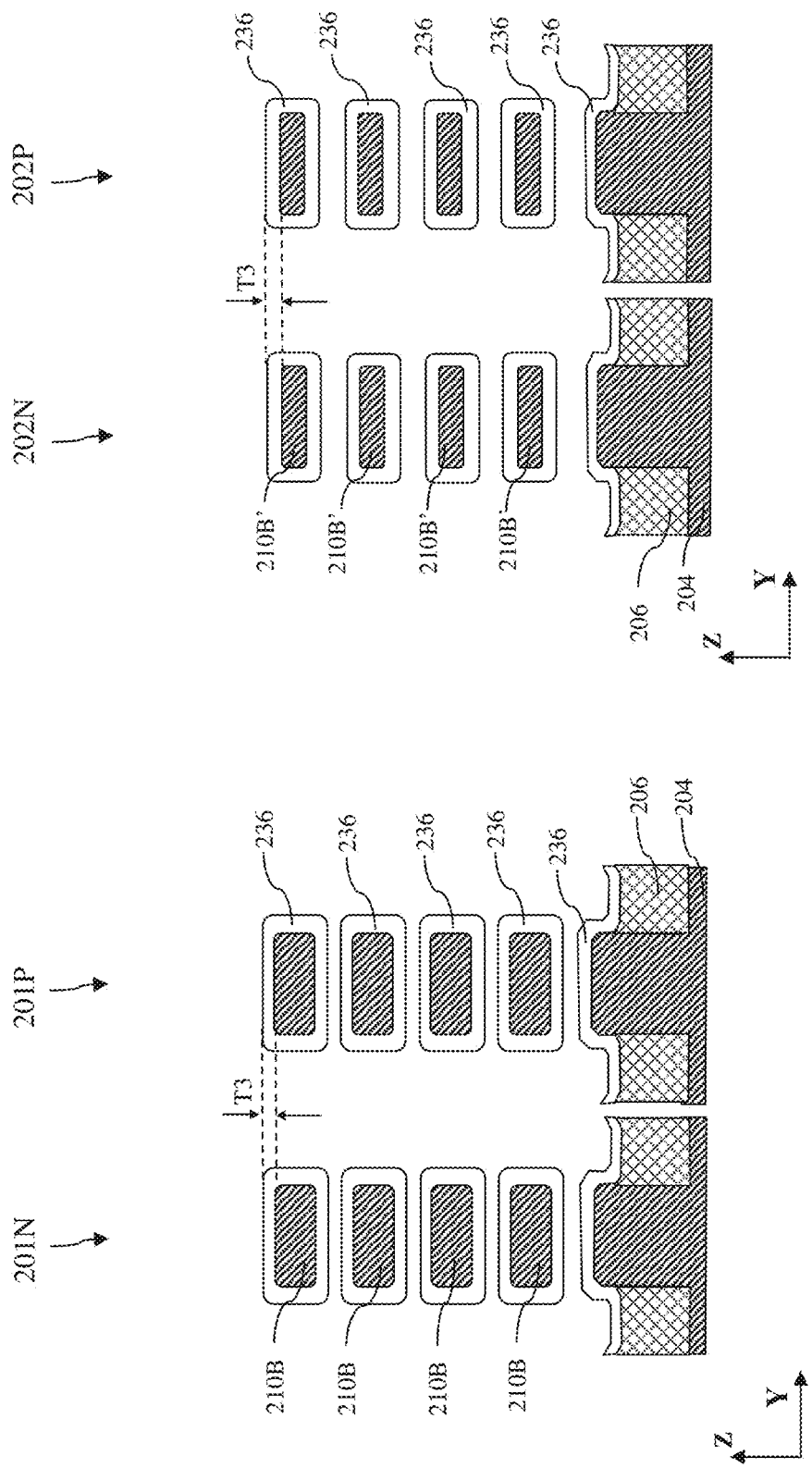

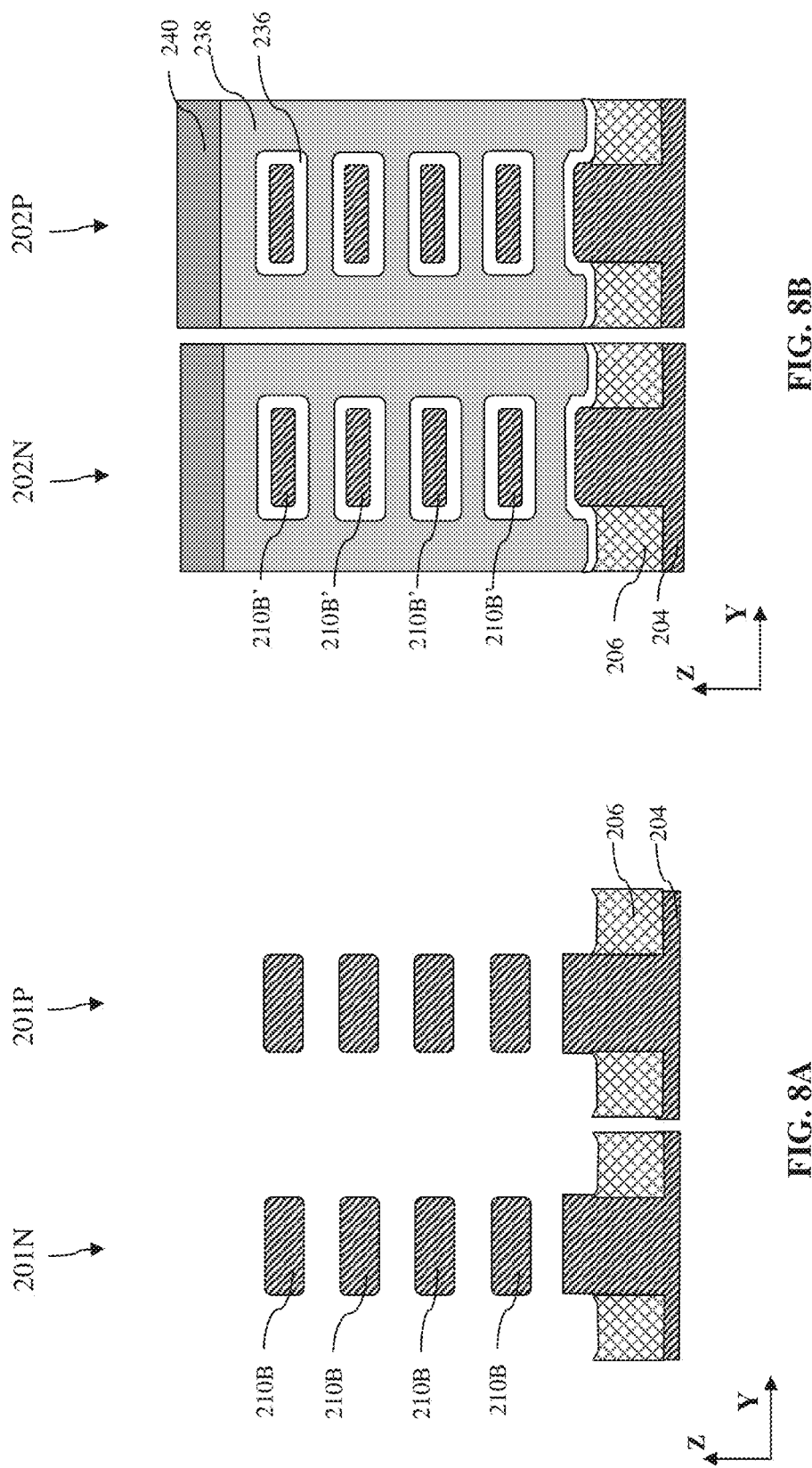

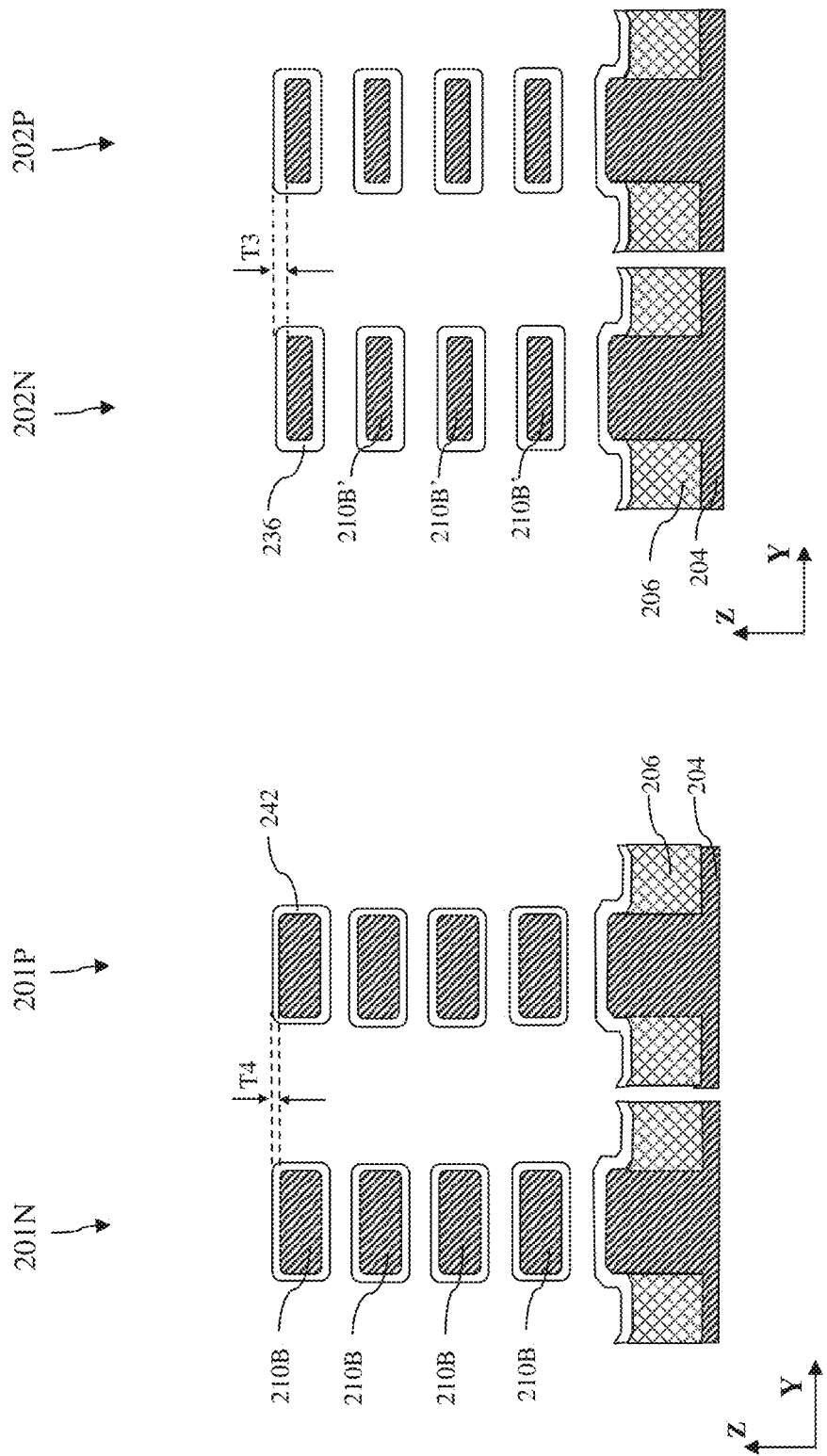

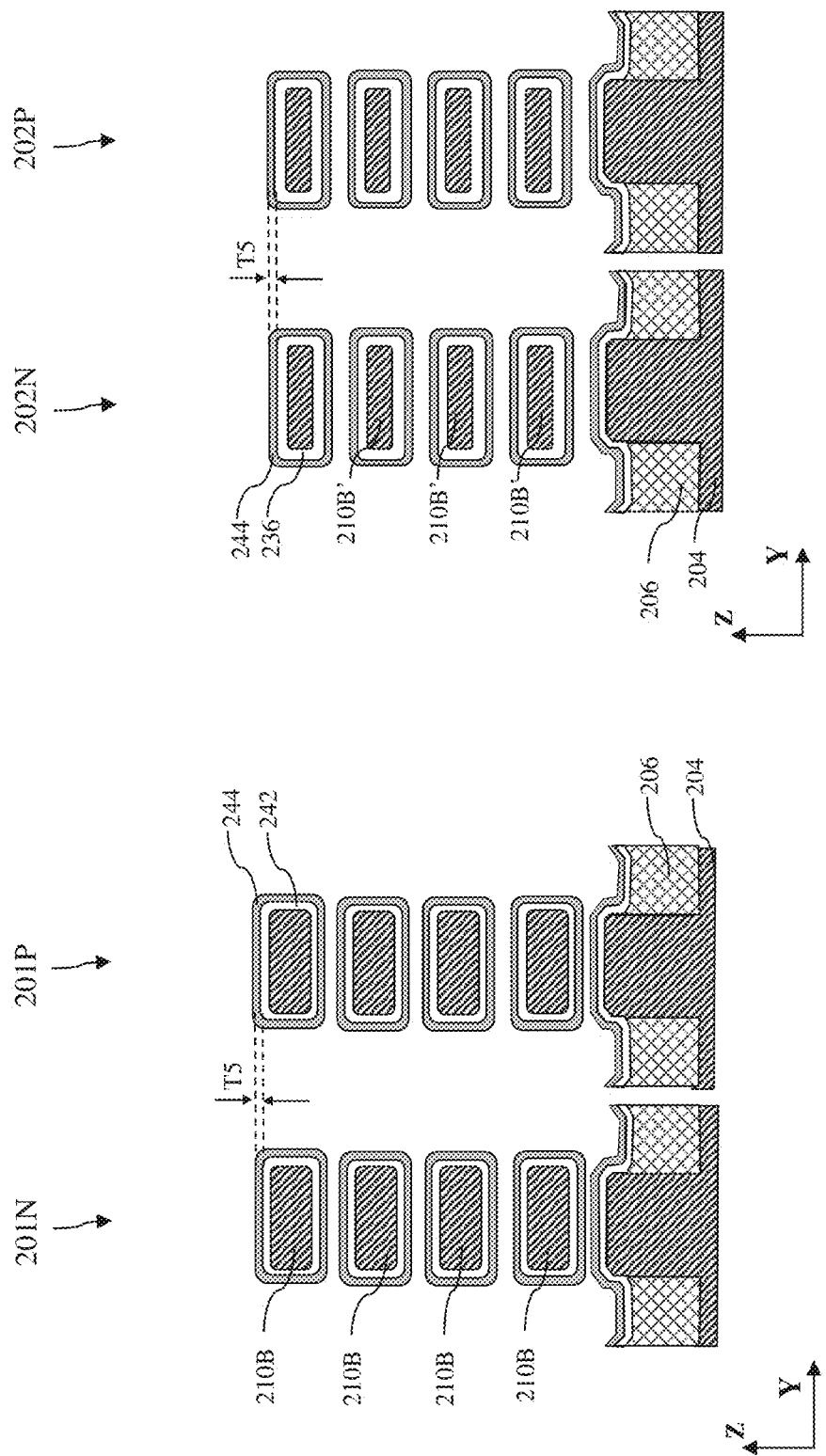

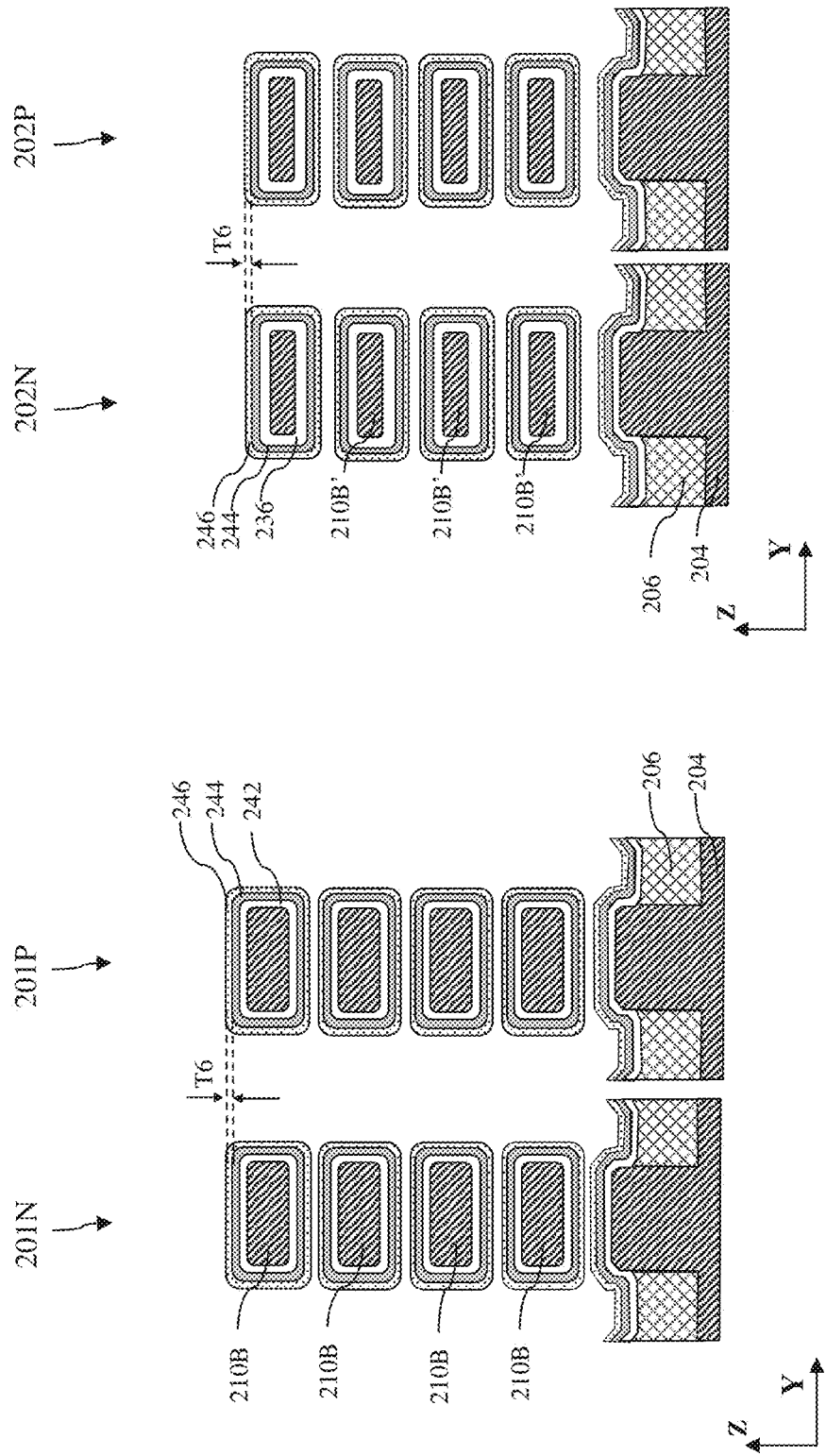

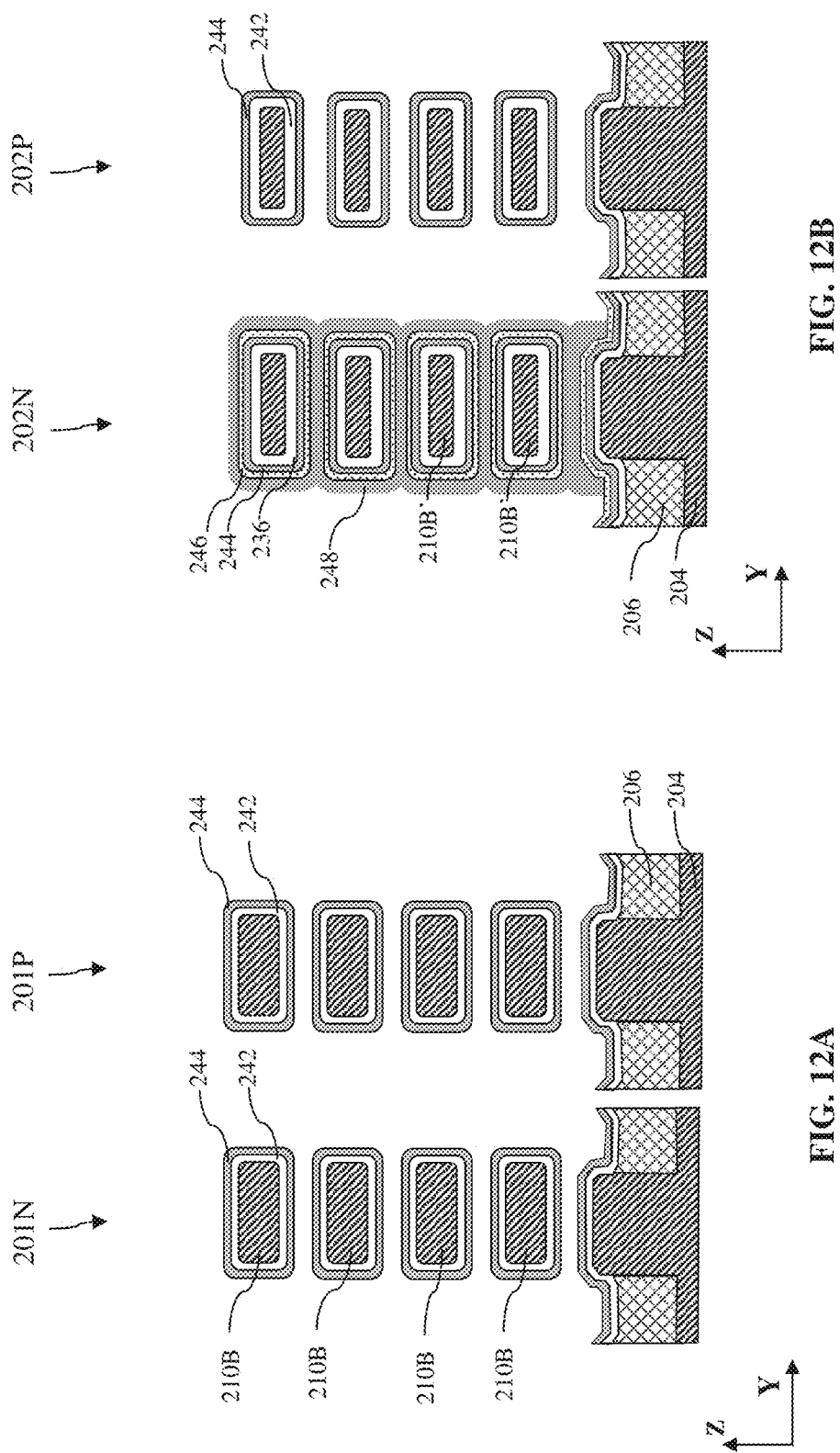

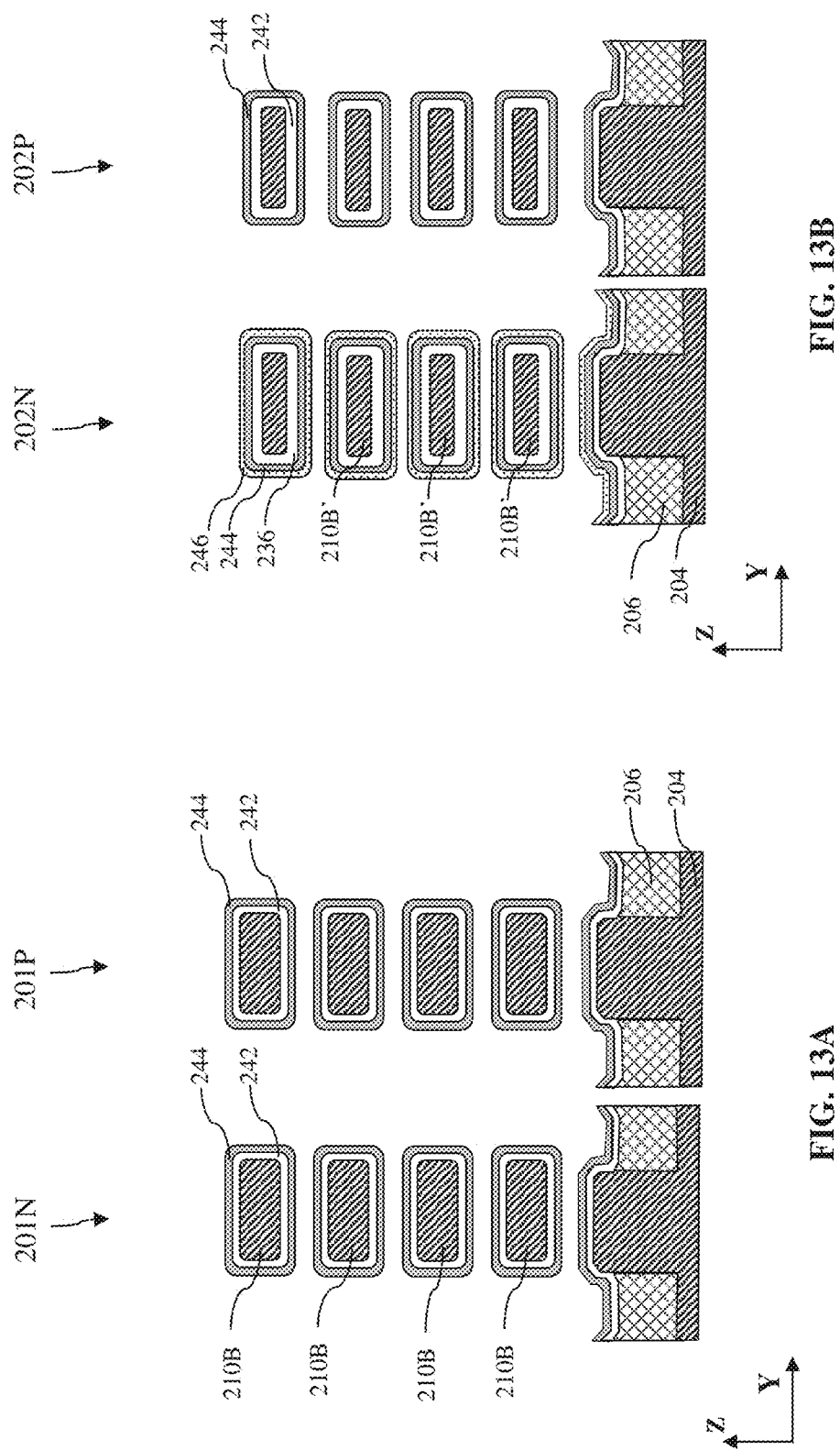

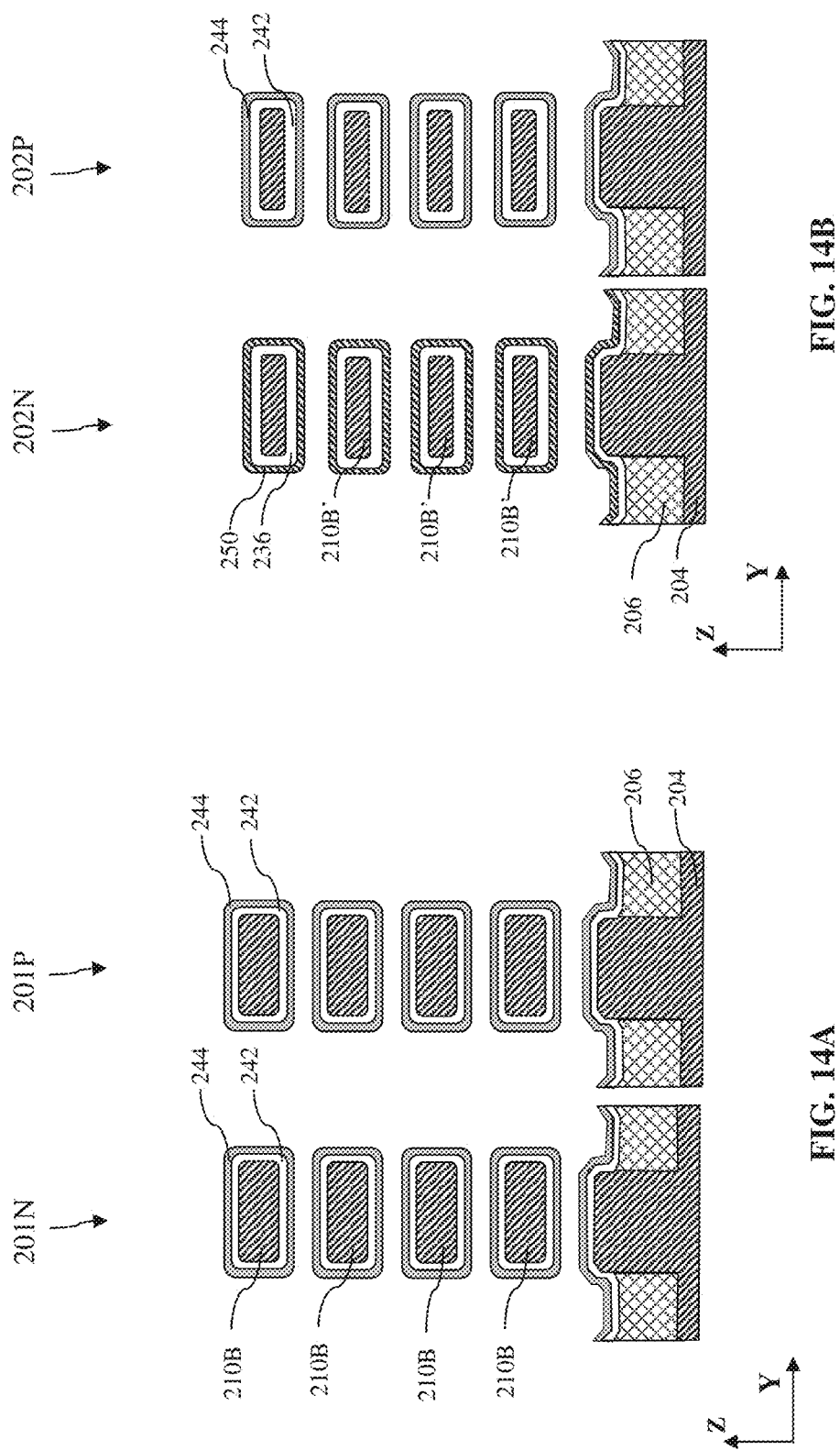

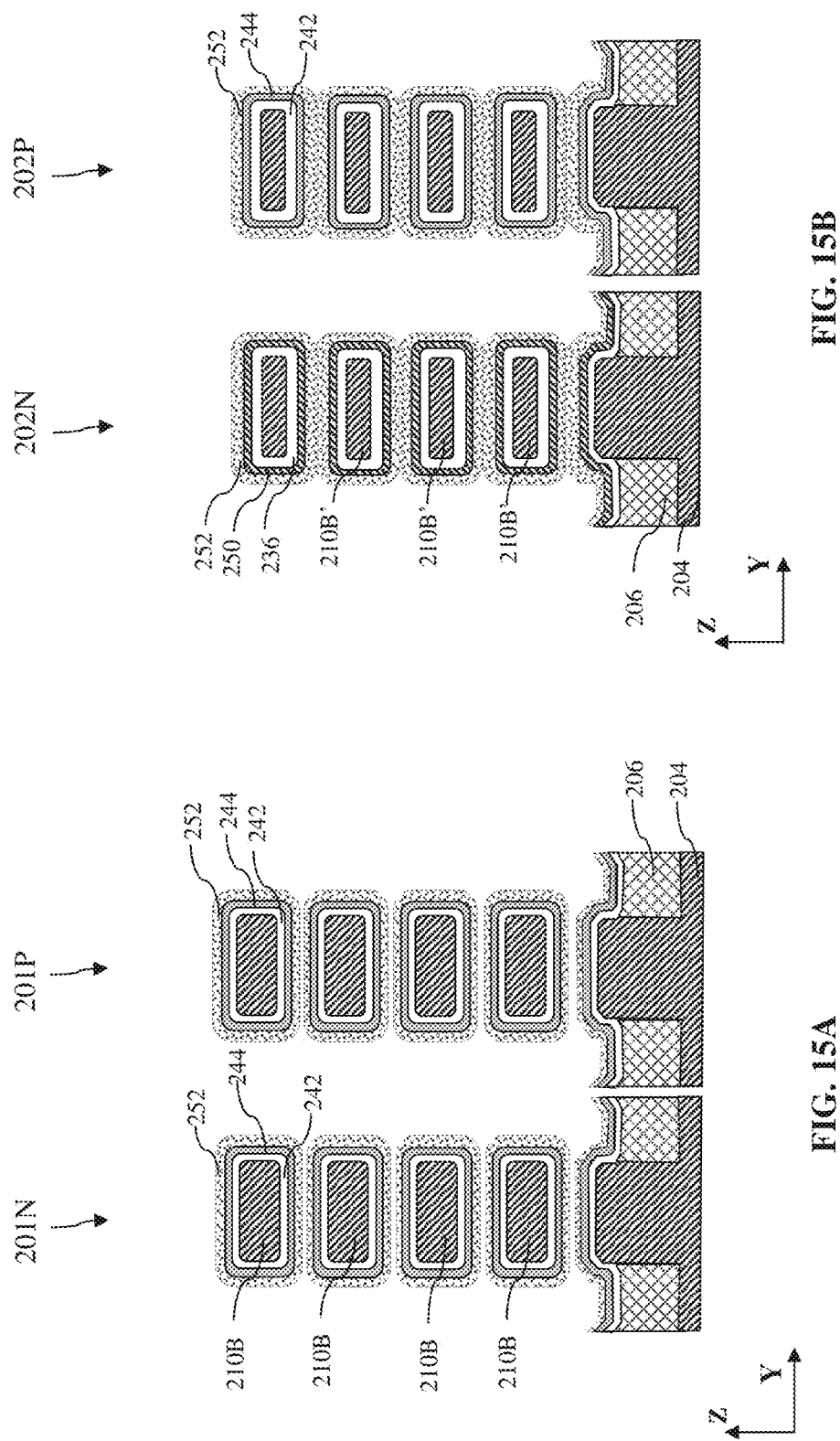

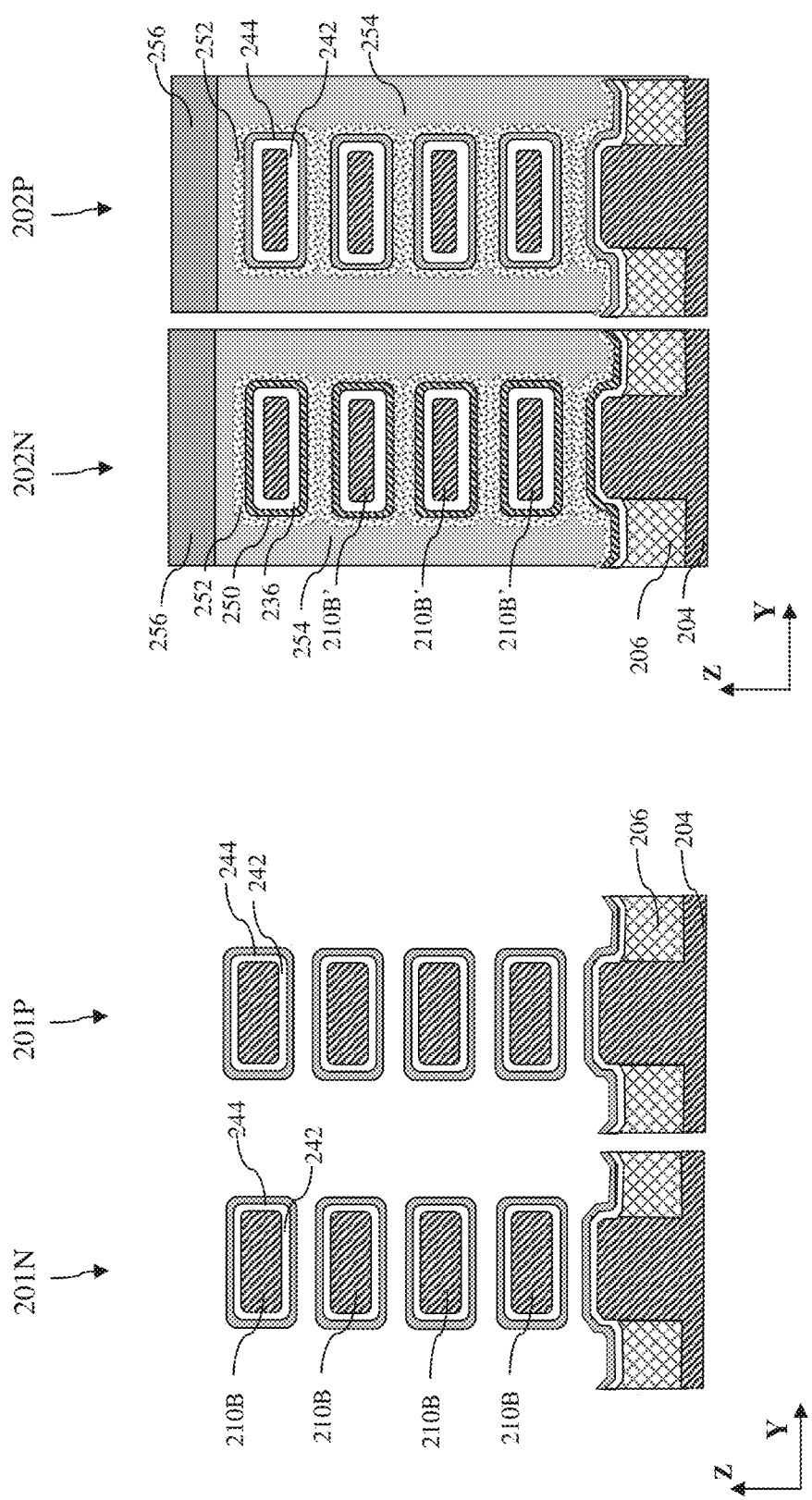

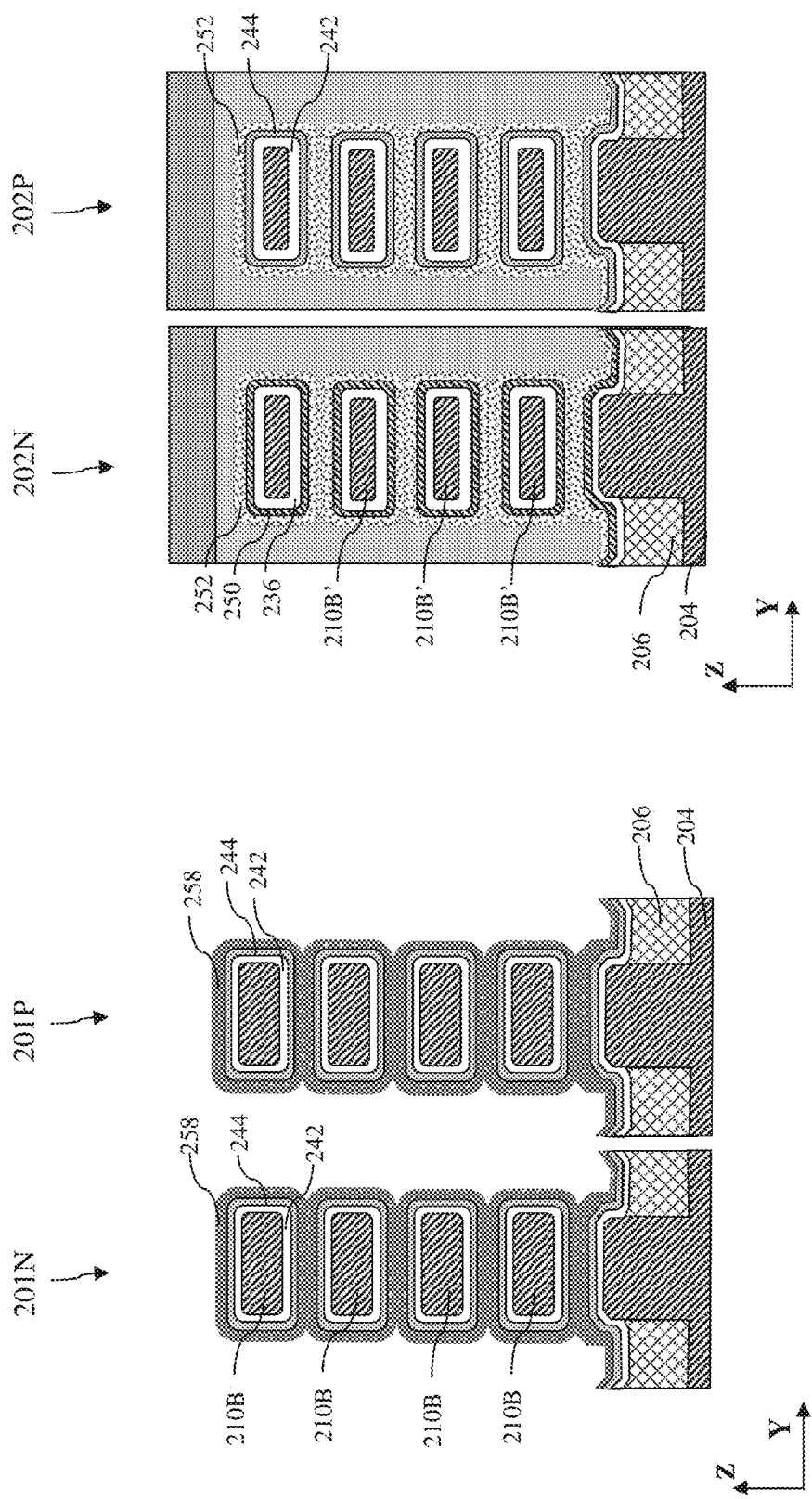

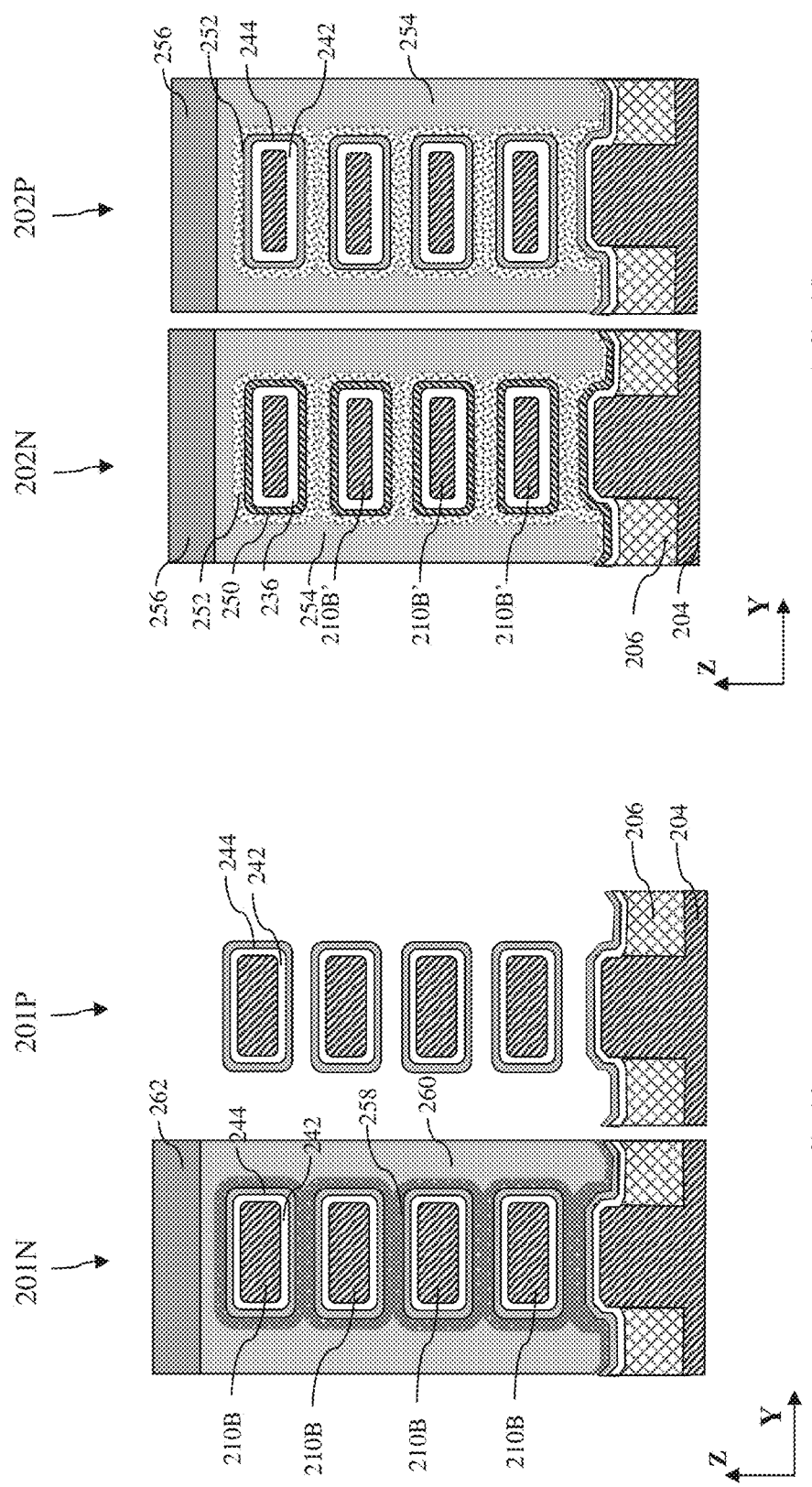

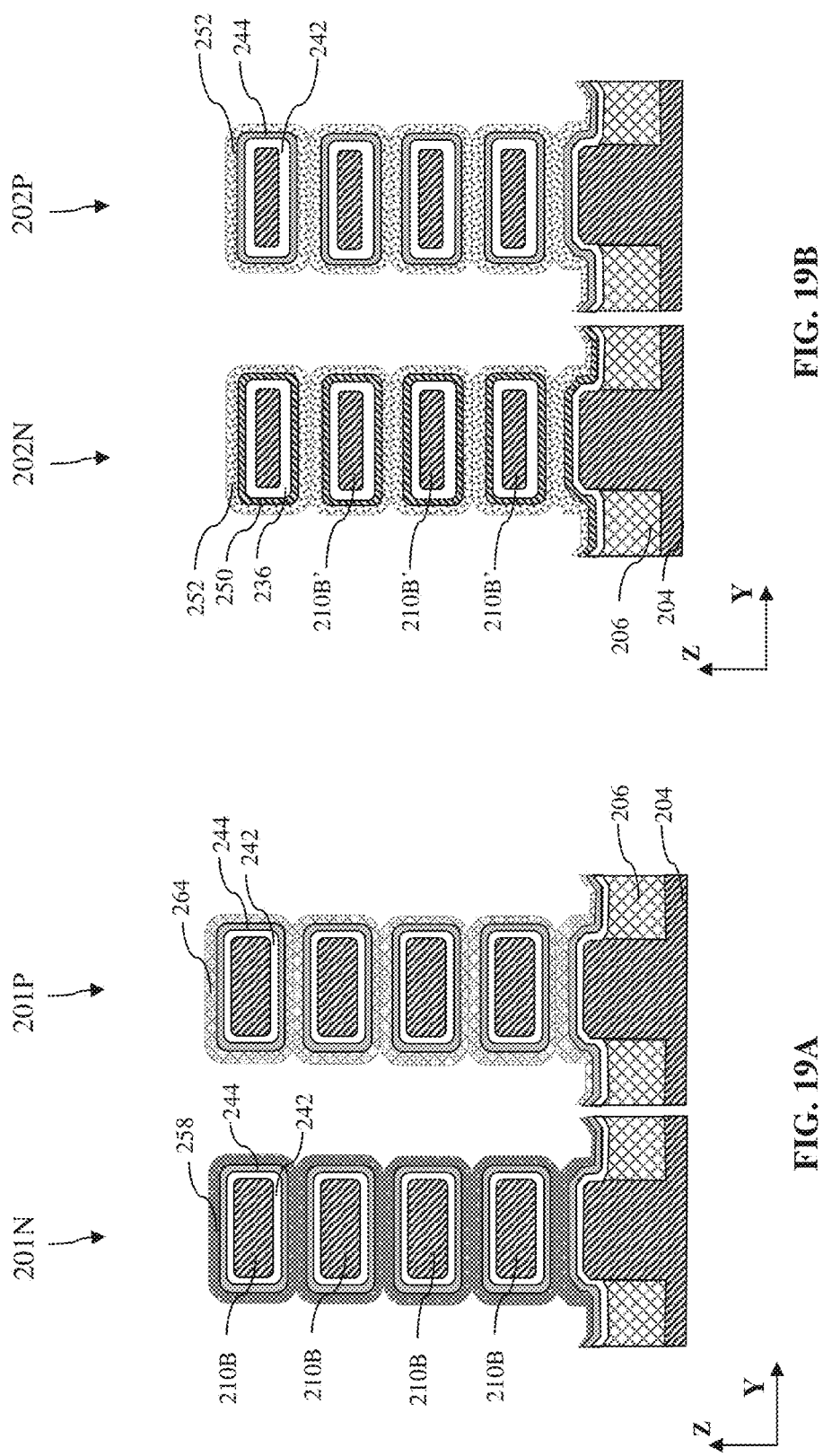

US 11,710,667 B2

GATE-ALL-AROUND DEVICE WITH TRIMMED CHANNEL AND DIPOLED DIELECTRIC LAYER AND METHODS OF FORMING THE SAME

This is a non-provisional application of and claims benefit of U.S. Provisional Patent Application Ser. No. 62/892,076, filed Aug. 27, 2019, the entire disclosure of which is incorporated herein by reference.

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, usually the threshold voltage (Vt) of a semiconductor device is achieved by adjusting the work function metal (WFM) in a gate electrode. However, due to the thicker gate interfacial layer in the input/output (I/O) area than in the core area, the space between the channel semiconductor layers in the I/O area is very limited. Therefore, the high-k dielectric layers may be merged between the channel semiconductor layers in the I/O area, and there is no room for the WFM to be formed between the channel semiconductor layers. Thereby, the desired Vt of the semiconductor device in the I/O area cannot be achieved by applying the WFM, and a high threshold voltage (Vt) may occur, which degrades the GAA device's performance. Improvements are thus needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 5A, 6A, 7A, 8A, 9A, 10A, 11A, 12A, 13A, 14A, 15A, 16A, 17A, 18A, 19A, and 20A illustrate cross-sectional views of different types of semiconductor devices in the core area of the example IC at intermediate stages of the method of FIG. 1 in accordance with some embodiments of the present disclosure; and FIGS. 4B, 5B, 6B, 7B, 8B, 9B, 10B, 11B, 12B, 13B, 14B, 15B, 16B, 17B, 18B, 19B, and 20B illustrate cross-sectional views of different types of semiconductor devices in the I/O area of the example IC at intermediate stages of the method of FIG. 1 in accordance with some embodiments of the present disclosure.

DETAILED DESCRIPTION

Figure 1:
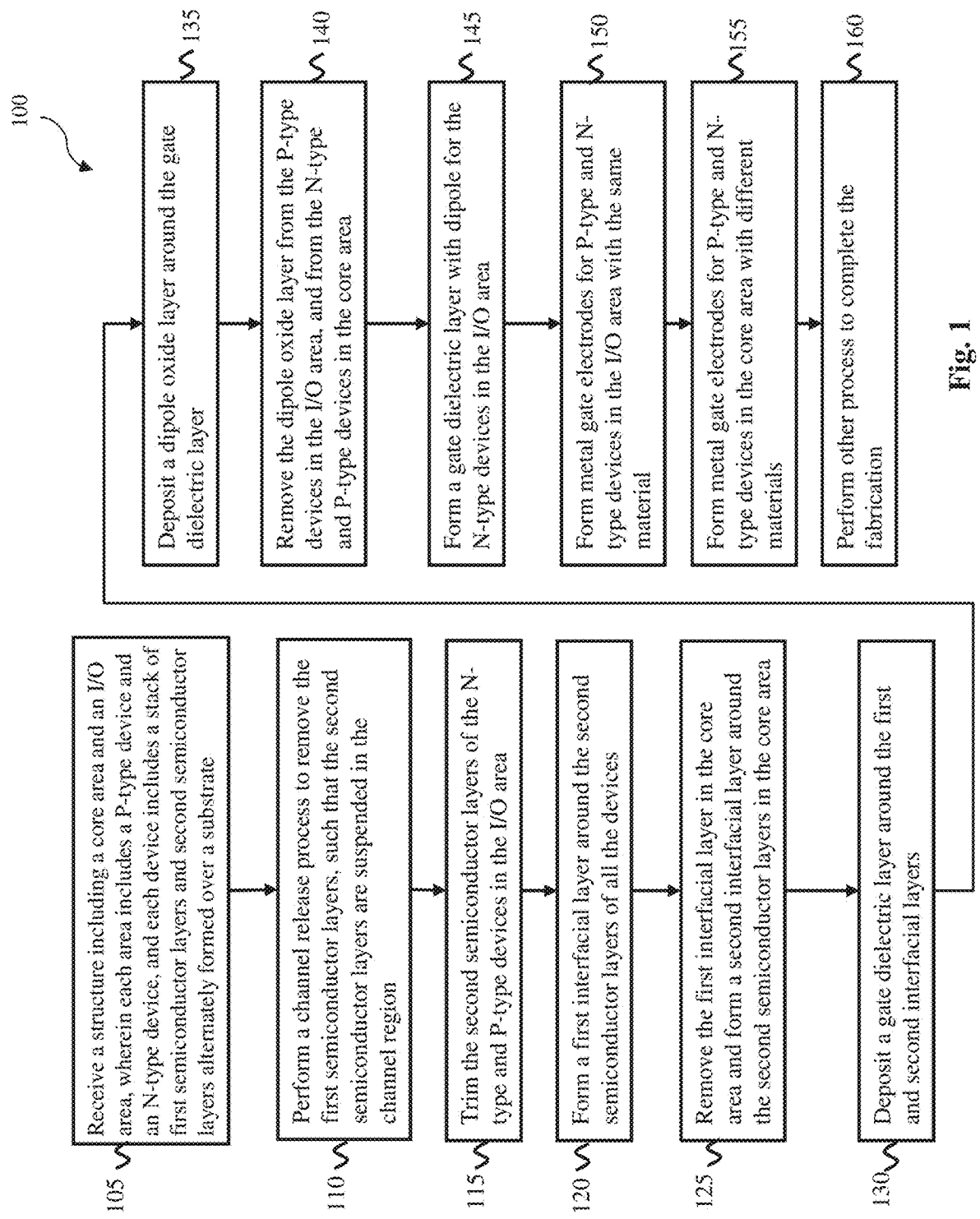
FIG. 1 illustrates a flowchart of an example method for making an example integrate circuit (IC) in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may include multiple layers of semiconductor material physically separated from one another. In some examples, a gate of the device is disposed above, alongside, and even between the semiconductor layers of the device. This configuration may place more semiconductor material proximate to the gate and thereby improve the control of carriers through the channel region. In turn, the GAA device allows more aggressive gate length scaling for both performance and density improvement than a fin-like field-effect-transistor (FinFET) device. However, in a conventional GAA device, especially in a GAA device in the I/O area of an IC, due to the thick gate interfacial layer, the space between the channel semiconductor layers are very limited, thus the high-k dielectric layers may be merged therebetween and there is no room for the gate electrode, including work function metal (WFM) and bulk metal, to be inserted between the channel semiconductor layers. In addition, due to the merging of the high-k dielectric layer between the channel semiconductor layers, dipole process cannot be applied to the merged portion of the high-k dielectric layer. Therefore, the desired threshold voltage of the semiconductor device in the I/O area cannot be achieved by adjusting the WFM, neither by the dipole process. The semiconductor device in the I/O area may have a higher threshold voltage than desired, and the performance is degraded.

The present disclosure is generally related to formation of GAA devices, wherein the channel semiconductor layers of the semiconductor device in the I/O area are trimmed, such that the channel semiconductor layers in the I/O area are thinner than those in the core area, therefore the space between the channel semiconductor layers of the semiconductor device in the I/O area is enlarged. Thereby, the merging issue of the high-k dielectric layers between the channel semiconductor layers in the I/O area is mitigated, work function metal layer(s) may be formed between the channel semiconductor layers and the high-k dielectric layer may be dipoled such that it can provide different desired threshold voltage for different devices even though the different devices may have the same gate electrode material. Of course, these advantages are merely examples, and no particular advantage is required for any particular embodiment.

Figure 2:
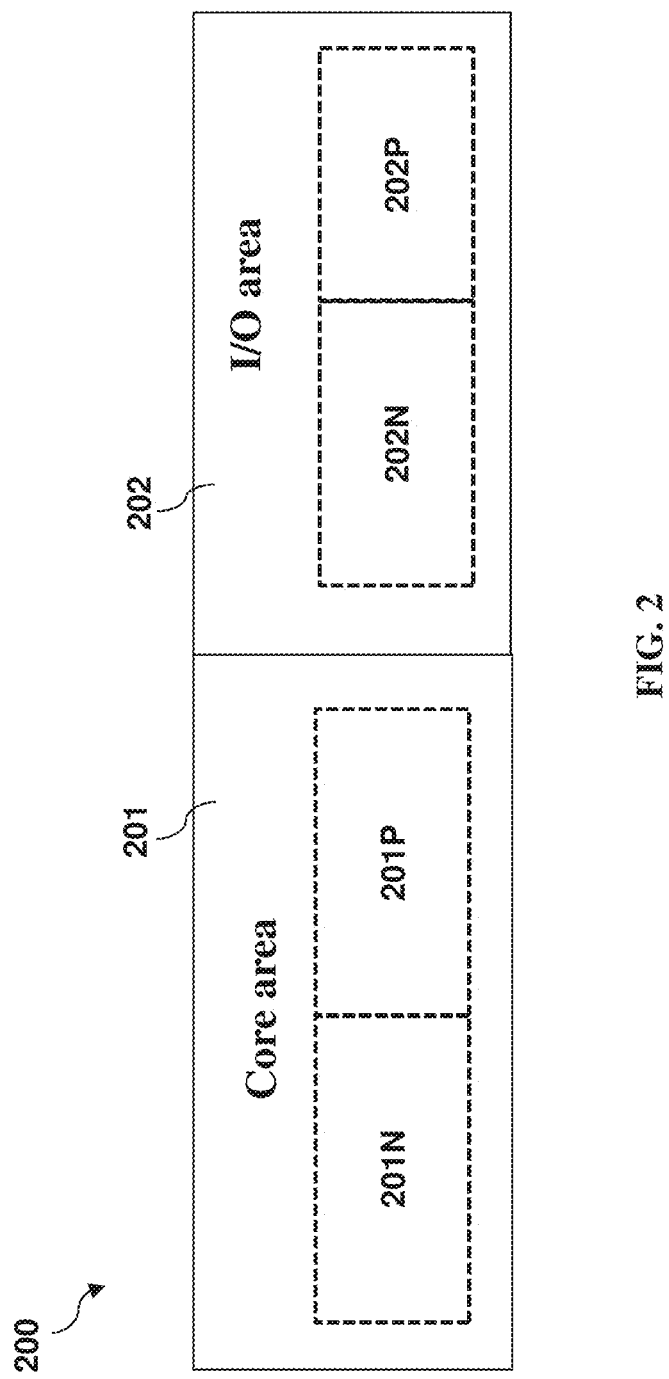
FIG. 2 illustrates a schematic diagram of the example IC comprising different types (n-type and p-type) of semiconductor devices in a core area and an I/O area in accordance with some embodiments of the present disclosure.
Figure 3:
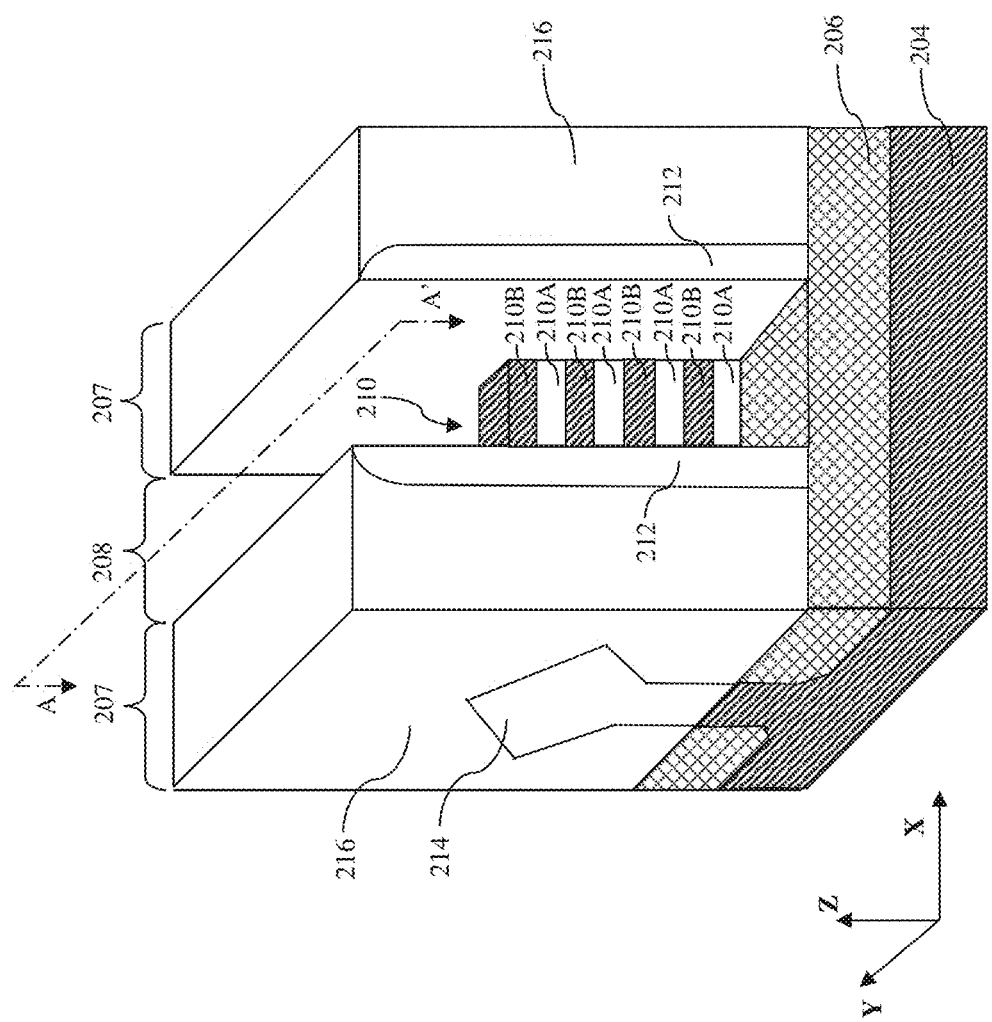
FIG. 3 illustrates a three-dimensional perspective view of one example semiconductor device at intermediate stages of the method of FIG. 1 in accordance with some embodiments of the present disclosure.

FIG. 1 illustrates a flow chart of a method 100 for making an example integrated circuit 200 (hereinafter, IC 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate schematic diagram of IC 200, various three-dimensional and cross-sectional views of the device(s) in IC 200 during intermediate steps of method 100. In particular, FIG. 2 illustrates a schematic diagram of the IC 200 comprising different types (n-type and p-type) of semiconductor devices in a core area and in an I/O area in accordance with some embodiments of the present disclosure. FIG. 3 illustrates a three-dimensional view of one of the semiconductor devices of IC 200 at an initial stage of the method 100. FIGS. 4A-20A illustrate cross-sectional views of different types of semiconductor devices in the core area of the IC 200 taken along the plane A-A' shown in FIG. 3 (that is, in a Y-Z plane). And, FIGS. 4B-20B illustrate cross-sectional views of different types of semiconductor devices in the I/O area of the IC 200 taken along the plane A-A' shown in FIG. 3 (that is, in a Y-Z plane).

In some implementations, IC 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), fin-like FETs (FinFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2, 3, 4A-20A and 4B-20B are simplified for the sake of clarity to better understand the inventive concepts of the present disclosure. The present disclosure is not limited to any particular number of devices or device regions, or to any particular device configurations.

Referring to FIGS. 1, 2, 3, 4A and 4B at operation 105, an initial semiconductor structure of IC 200 is received. As depicted in FIG. 2, IC 200 comprises a core area 201 (which may include logic devices or memory devices) and an I/O area 202 (which may include input, output, or input/output devices). In some embodiments, IC 200 may comprise other areas. In the present embodiment, the core area 201 and the I/O area 202 are areas of an IC formed on a single semiconductor substrate (for example, substrate 204 in FIGS. 3, 4A-20A, and 4B-20B). Core area 201 comprises different devices, such as n-type semiconductor device(s) 201N and p-type semiconductor device(s) 201P. Similarly, I/O area 202 comprises different devices, such as n-type semiconductor device(s) 202N and p-type semiconductor device(s) 202P.

FIG. 3 is a three-dimensional view of an initial semiconductor structure of one semiconductor device (for example, device 201N, 201P, 202N, or 202P) received at operation 105. FIGS. 4A and 4B are cross-section views along plane A-A' in FIG. 3 for the semiconductor devices 201N, 201P, 202N, and 202P in different areas (core area 201 or I/O area 202) of IC 200. For example, in FIG. 4A, device 201N is an n-type device in the core area and device 201P is a p-type device in the core area. And, in FIG. 4B, device 202N is an n-type device in the I/O area; and device 202P is a p-type device in the I/O area.

Referring to FIGS. 3, 4A and 4B, IC 200 includes a substrate 204. The substrate 204 is a bulk substrate that includes silicon. Alternatively or additionally, the bulk substrate includes another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 204 may include indium tin oxide (ITO) glass, include silicon on insulator (SOI) substrate, be strained and/or stressed for performance enhancement.

As discussed above, each of the core area 201 and the I/O area 202 of the substrate 204 may include various doped regions. In some embodiments, the substrate 204 includes n-type doped regions (for example, n-type wells) doped with n-type dopants, such as phosphorus (for example, $^{31}P$), arsenic, other n-type dopant, or combinations thereof. In some embodiments, the substrate 204 includes p-type doped region (for example, p-type wells) doped with p-type dopants, such as boron (for example, $^{11}B$, $BF_2$), indium, other p-type dopant, or combinations thereof. In some embodiments, the substrate 204 includes doped regions formed with a combination of p-type dopants and n-type dopants. The various doped regions can be formed directly on and/or in the substrate 204, for example, providing a p-well structure, an n-well structure, a dual-well structure, a raised structure, or combinations thereof. An ion implantation process, a diffusion process, and/or other suitable doping process can be performed to form the various doped regions.

The semiconductor structure also comprises a semiconductor layer stack 210 (hereinafter, stack 210) formed over the substrate 204. In the depicted embodiment, the stack 210 includes alternating semiconductor layers, such as first semiconductor layers 210A including a first semiconductor material and second semiconductor layers 210B including a second semiconductor material that is different from the first semiconductor material. The different semiconductor materials in the semiconductor layers 210A and 210B have different oxidation rates and/or different etch selectivity. In some embodiments, the second semiconductor material of the second semiconductor layers 210B is the same as the substrate 204. For example, the first semiconductor layers 210A comprise silicon germanium (SiGe), and the second semiconductor layers 210B comprise Si (like the substrate 204). Thus, the stack 210 is arranged with alternating SiGe/Si/SiGe/Si/ . . . layers from bottom to top. In some embodiments, the material of the top semiconductor layer may or may not be the same as the bottom semiconductor layer in the stack. For example, for a stack that includes alternating SiGe and Si layers, the bottom semiconductor layer comprises SiGe, and the top semiconductor layer may comprise Si or SiGe. In the depicted embodiment, the bottom semiconductor layer 210A comprises SiGe, while the top semiconductor layer 210B comprises Si. In some embodiments, the second semiconductor layers 210B may be undoped or substantially dopant-free. In other words, no intentional doping is performed when forming the second semiconductor layers 210B. In some other embodiments, the semiconductor layers 210B may be doped with a p-type dopant, such as boron (B, $^{11}$B or $BF_2$), gallium (Ga), or combinations thereof, or an n-type dopant, such as phosphorus (P, $^{31}$P), arsenic (As), or combinations thereof. The number of the semiconductor layers 210A and 210B in the stack 210 depends on the design of IC 200. For example, the stack 210 may comprise one to ten layers of semiconductor layers 210A or 210B each. In some embodiments, different semiconductor layers 210A and 210B in the stack 210 have the same thickness in the Z-direction. In some other embodiments, different semiconductor layers 210A and 210B in the stack 210 have different thicknesses.

The stack 210 is formed over the substrate 204 using any suitable process. In some embodiments, the semiconductor layers 210A and/or 210B are formed by suitable epitaxy process. For example, semiconductor layers comprising SiGe and Si are formed alternately over the substrate 204 by a molecular beam epitaxy (MBE) process, a chemical vapor deposition (CVD) process, such as a metal organic CVD (MOCVD) process, and/or other suitable epitaxial growth processes. Thereafter, a photoresist and an etching process may be performed to the semiconductor layers to form the stack 210 (comprising semiconductor layers 210A and 210B) in a fin-shape as illustrated in FIGS. 4A and 4B. The fin-shape stack 210 extends along the X-direction and comprises a channel region 208, a source region, and a drain region (hereinafter both referred to as S/D regions 207) (FIG. 3). The S/D regions 207 are interposed by the channel region 208. As illustrated in FIG. 3, the plane A-A' is taken in the channel region 208 of the stack 210.

The semiconductor structure also includes an isolation feature 206 formed over the substrate 204 to separate and isolate the active regions of IC 200. In some embodiments, one or more dielectric materials, such as silicon dioxide ($SiO_2$) and/or silicon nitride ($Si_3N_4$), is deposited over the substrate 204 along sidewalls of the stack 210. The dielectric material may be deposited by CVD, plasma enhanced CVD (PECVD), physical vapor deposition (PVD), thermal oxidation, or other techniques. Subsequently, the dielectric material is recessed (for example, by etching) to form the isolation feature 206. In some embodiments, a top surface of the isolation feature 206 is substantially coplanar with or lower than a bottom surface of the lowermost first semiconductor layer 210A, as depicted in FIGS. 3, 4A and 4B.

The semiconductor structure also includes gate spacers 212 formed over the stack 210. In some embodiments, the gate spacers 212 comprise a dielectric material, such as silicon dioxide ($SiO_2$), silicon nitride ($Si_3N_4$), silicon oxynitride (SiON), or silicon carbide (SiC). The gate spacers 212 are formed by any suitable process. For example, first, a dummy gate stack (comprising polysilicon, not shown) is formed over the channel region 208 of the stack 210. A spacer layer comprising the dielectric material is then deposited (for example, by atomic layer deposition (ALD), CVD, PVD, or other proper process) over the substrate 204 and the dummy gate stack. Subsequently, the spacer layer is anisotropically etched to remove the portions in the X-Y plane (the plane in which the top surface of the substrate 204 is). The remaining portions of the spacer layer become the gate spacers 212.

Thereafter, S/D regions 207 of the stack 210 may be recessed along sidewalls of the gate spacers 212, and inner spacers (not shown) are formed between edges of the semiconductor layers 210B. In some embodiments, S/D regions 207 of the stack 210 are recessed by a S/D etching process performed along the gate spacers 212 to form S/D trenches. The S/D etching process may be a dry etch, a wet etch, or combinations thereof. A time control is performed to the S/D etching process, such that the sidewalls of each semiconductor layers 210A and 210B are exposed in the S/D trenches. Thereafter, portions (edges) of the semiconductor layers 210A exposed in the S/D trenches are selectively removed by a suitable etching process to form gaps between adjacent semiconductor layers 210B. In other words, edges of the semiconductor layers 210B are suspended in the S/D regions 207. Subsequently, inner spacers (not shown) are formed to fill in the gaps between the adjacent semiconductor layers 210B. The inner spacers comprise a dielectric material that is similar to the material of the gate spacers, such as $SiO_2$, $Si_3N_4$, SiON, SiC, or combinations thereof. The dielectric material of the inner spacers may be deposited in the S/D trenches and in the gaps between the semiconductor layers 210B by CVD, PVD, ALD, or combinations thereof. Extra dielectric material is removed along sidewalls of the gate spacers 212 until the sidewalls of the semiconductor layers 210B are exposed in the S/D trenches.

Thereafter, epitaxial S/D features 214 are formed in the S/D regions 207 of the stack 210. In some embodiments, the epitaxial S/D features 214 may include a semiconductor material such as silicon (Si) or germanium (Ge); a compound semiconductor such as silicon germanium (SiGe), silicon carbide (SiC), gallium arsenide (GaAs), etc.; an alloy semiconductor; or combinations thereof. An epitaxy process may be implemented to epitaxially grow S/D features 214. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. Epitaxial S/D features 214 may be doped with n-type dopants and/or p-type dopants. In some embodiments, epitaxial S/D features 214 may include multiple epitaxial semiconductor layers, and different epitaxial semiconductor layers are different in amount of dopant included therein.

The semiconductor structure also includes an interlayer dielectric (ILD) layer 216 formed over the substrate 204. As illustrated in FIG. 3, the ILD 216 is disposed along the gate spacers 212 and covers the isolation feature 206 and the epitaxial S/D features 214. In some embodiments, the ILD layer 216 includes a low-k dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 216 may include a multi-layer structure having multiple dielectric materials and may be formed by a deposition process such as CVD, flowable CVD (FCVD), spin-on-glass (SOG), other suitable methods, or combinations thereof. In some embodiments, an etch stop layer (ESL, not shown) including dielectric material(s) (such as $SiO_2$, SiON, $Si_3N_4$, SiCN, SiOC, SiOCN) may be deposited between the ILD layer 216 and the isolation feature 206 and between the ILD layer 216 and the epitaxial S/D features 214.

After the formation of the ILD layer 216, the dummy gate stack may be removed to form a gate trench that exposes the channel region 208 of the stack 210. In some embodiments, removing the dummy gate stack includes one or more etching processes, such as wet etching, dry etching, reactive-ion etching (RIE), or other etching techniques.

Now referring to FIGS. 1, 5A, and 5B, at operation 110, a channel release process is performed, such that the semiconductor layers 210A are removed from the gate trench. As a result, the semiconductor layers 210B are suspended in the channel region. The suspended semiconductor layers 210B (also referred to as channel semiconductor layers) are collectively referred to as a stack structure. The semiconductor layers 210A are removed by a selective etching process that is tuned to remove only the semiconductor layers 210A while the semiconductor layers 210B remain substantially unchanged. The selective etching may be a selective wet etching, a selective dry etching, or a combination thereof. In some embodiments, the selective wet etching process may include a hydro fluoride (HF) or $NH_4OH$ etchant. In some embodiments, the selective removal of semiconductor layers 210A may include an oxidation process followed by oxidation removal. For example, the SiGe oxidation process may include forming and patterning various masking layers such that the oxidation is controlled to the SiGe layers 210A. In other embodiments, the SiGe oxidation process is a selective oxidation due to the different compositions of the semiconductor layers 210A and 210B. In some examples, the SiGe oxidation process may be performed by exposing the IC 200 to a wet oxidation process, a dry oxidation process, or a combination thereof. Thereafter, the oxidized semiconductor layers 210A, which include $SiGeO_x$, are removed by an etchant such as $NH_4OH$ or diluted HF.

As depicted in FIGS. 5A and 5B, each of the stack structures includes the channel semiconductor layers 210B separated from each other and stacked up along a direction (Z-direction) generally perpendicular to a top surface of the substrate 204 (X-Y plane). In some embodiments, the semiconductor layers 210B are slightly etched or not etched during the operation 110. Further, semiconductor layers 210B may be of any suitable shapes, such as a wire-like shape, a sheet-like shape, or other geometrical shape (for other stack structure GAA transistors). In the depicted embodiment, each of the semiconductor layers 210B has a thickness T1 in the Z-direction, and the adjacent suspended semiconductor layers 210B are separated with a space S1 in the Z-direction. In some embodiments, the thickness T1 is about 3 nm to about 20 nm. In some embodiments, the space S1 is about 5 nm to about 15 nm.

Figures 6A, 6B:
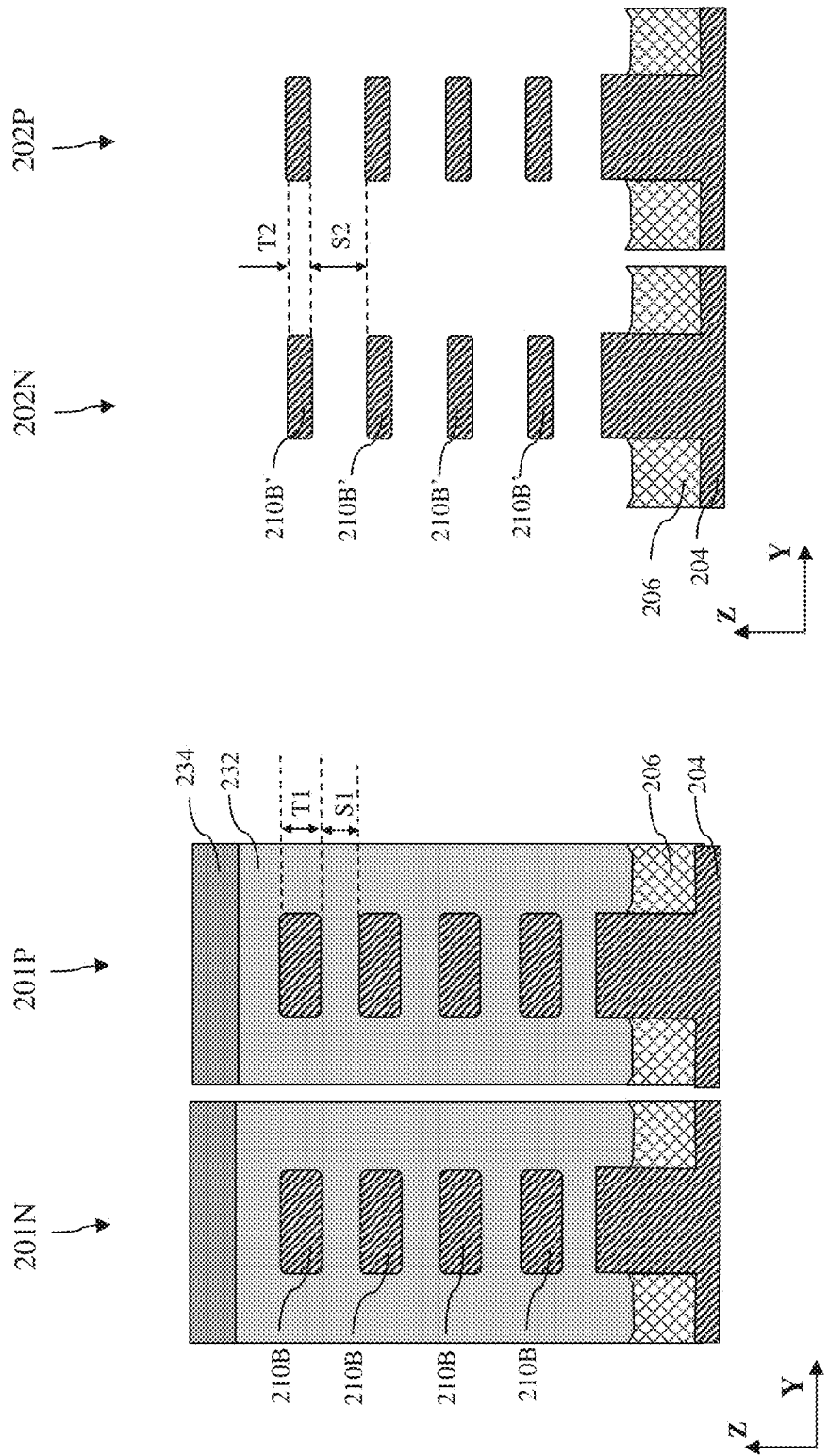

Now referring to FIGS. 1, 6A and 6B, at operation 115, the semiconductor layers 210B of the N-type device 202N and the P-type device 202P in the I/O area are further trimmed from the thickness T1 to a thinner thickness T2. This extra trimming is different from the slightly etching, if any, in the operation 110. The purpose of this trimming is to reduce the thickness of the channel semiconductor layers in the I/O area and enlarge the space therebetween. Referring to FIG. 6A, before the trimming, a hard mask 232 (for example, a bottom anti-reflective coating (BARC) layer) is formed to cover the N-type device 201N and the P-type device 201P in the core area. The hard mask 232 may be formed by various steps. For example, first, a hard mask 232 is formed over the substrate 204 by a deposition process including CVD, PVD, ALD, spin on, other suitable methods, or combinations thereof. Thereafter, a photoresist layer 234 is formed over the hard mask 232. The photoresist layer 234 is patterned such that a portion of the hard mask 232 over the I/O area is exposed from the photoresist layer 234. Subsequently, the portion of the hard mask 232 exposed in the photoresist layer 234 is removed to expose the semiconductor devices 202N and 202P in the I/O area. In some embodiments, removing of the exposed portion of the hard mask 232 includes a suitable etching process, such as a dry etch, a wet etch, or combinations thereof. The remaining portion of the hard mask 232 and the photoresist layer 234 are used as protective mask when trimming the semiconductor layers 210B of the devices 202N and 202P in the I/O area.

Thereafter, an etching process is performed to the semiconductor layers 210B of the N-type device 202N and the P-type device 202P in the I/O area. The etching process may include a dry etching, a wet etching, other etching process, or combinations thereof. In some embodiments, the etching process is an anisotropic etching process, such that only the thickness (in the Z-direction) of the semiconductor layers 210B in the I/O area are trimmed while the length and width (in the X-Y plane) of the semiconductor layers 210B in the I/O area remain substantially unchanged. In some embodiments, the trimming process may include an oxidation process followed by oxidation removal. And, the trimming extent depends on the oxidation level. In some embodiments, while the core area 201 of the IC 200 is covered by the hard mask 232, the I/O area 202 of the IC 200 is exposed to a wet oxidation process, a dry oxidation process, or a combination thereof. Thereafter, the oxidized semiconductor layers 210B, which include silicon dioxide ($SiO_2$), are trimmed by an etchant such as $NH_4OH$ or diluted HF. In some embodiments, the extent of trimming of the semiconductor layers 210B in the I/O area can be controlled by the extent of the oxidation. As depicted in FIG. 6B, in the I/O area, the trimmed semiconductor layers 210B' has a thickness T2 in the Z-direction, and the adjacent trimmed semiconductor layers 210B' are separated with space S2 in the Z-direction. The thickness T2 is less than the thickness T1 and the space S2 is larger than the space S1. In some embodiments, the sum of T1 and S1 is substantially equal to the sum of T2 and S2. In other words, a distance between the top surfaces of the adjacent trimmed semiconductor layers 210B' in the I/O area is substantially equal to a distance between the top surfaces of the adjacent semiconductor layers 210B in the core area. In some embodiments, about 5% to about 30% of the thickness T1 of the semiconductor layers 210B is trimmed away. In some embodiments, to ensure sufficient thickness of the channel semiconductor layers as well as to increase the space between the channel semiconductor layers for later dipole process and/or WFM fill, more than 1 nm of the thickness is trimmed away. Therefore, the thickness T2 is less than the thickness T1 for more than 1 nm (T2≤T1−1 nm), and the space S2 is larger than the space S1 for more than 1 nm (S2≥S1+1 nm). In some embodiments, the thickness T2 of the trimmed semiconductor layers 210B' is about 2 nm to about 19 nm, and the space S2 between the trimmed semiconductor layers 210B' is about 6 nm to about 16 nm. As depicted in FIG. 6A, the thickness T1 of the semiconductor layers 210B and the space S1 between the semiconductor layers 210B in the core area remain unchanged. After the trimming, the hard mask 232 and the photoresist layer 234 are removed by one or more etching processes.

Now referring to FIGS. 1, 7A and 7B, at operation 120, first interfacial layers 236 are formed around the suspended semiconductor layers 210B in the core area and the trimmed suspended semiconductor layers 210B' in the I/O area. The first interfacial layers 236 may also be deposited over the substrate 204 and the isolation feature 206. In some embodiments, the first interfacial layers 236 include materials such as $SiO_2$, SiON, HfSiO, other suitable materials, or combinations thereof. A deposition process may be performed to form the first interfacial layer 236 wrapping around the suspended semiconductor layers 210B. The deposition process includes CVD, PVD, ALD, other suitable methods, or combinations thereof. In some embodiments, a thickness T3 (in the Z-direction) of each of the first interfacial layer 236 is about 12 angstroms (Å) to about 31 Å. The thickness T3 is designed to be less enough to occupy less space (not increase the operation voltage) and greater enough to not break down (improve the reliability of the device). As depicted in FIGS. 7A and 7B, due to the different thicknesses of the semiconductor layers 210B in the core area and the trimmed semiconductor layers 210B' in the I/O area, the space between the first interfacial layers 236 are different in the core area and in the I/O area. For example, the thickness T1 of the semiconductor layers 210B in the core area is thicker than the thickness T2 of the trimmed semiconductor layers 210B' in the I/O area, the space between the first interfacial layers 236 in the core area is less than the space between the first interfacial layers 236 in the I/O area.

Now referring to FIGS. 1, 8A, 8B, 9A and 9B, at operation 125, the first interfacial layers 236 in the core area are removed, and second interfacial layers 242 are formed around the semiconductor layers 210B of the transistors 201N and 201P in the core area. Referring to FIGS. 8A and 8B, first, the semiconductor devices 202N and 202P in the I/O area are covered by a hard mask 238 (for example, a BARC layer) and a photoresist layer 240 disposed over the hard mask 238. The formation of the hard mask 238 and the photoresist layer 240 are similar to that of the hard mask 232 and the photoresist layer 234. Thereafter, an etching process is performed to remove the first interfacial layer 236 in the N-type device 201N and the P-type device 201P in the core area. The etching process may include a dry etch, a wet etch, other etching process, or combinations thereof. Subsequently, referring to FIGS. 9A and 9B, second interfacial layers 242 are formed around the semiconductor layers 210B of the transistors 201N and 201P in the core area. In some embodiments, the second interfacial layers 242 are also formed over the substrate 204 and the isolation feature 206. A material of the second interfacial layers 242 is similar like that of the first interfacial layer 236, for example, $SiO_2$, SiON, HfSiO, other suitable materials, or combinations thereof. In some embodiments, the second interfacial layers 242 are deposited over the semiconductor layers 210B in the core area, similar like that of the first interfacial layer 236. In some other embodiments, the second interfacial layers 242 are formed by an oxidation process in the core area, while the I/O area is covered by the hard mask 238 and the photoresist layer 240. For example, in the case that the semiconductor layers 210B include silicon, the core area of the IC 200 may be exposed to a wet oxidation process, a dry oxidation process, or a combination thereof. Thereby, a thin layer including $SiO_2$ is formed around each of the semiconductor layers 210B in the core area and works as a second interfacial layer 242. Thereafter, the hard mask 238 and the photoresist layer 240 are removed by one or more etching processes. As depicted in FIGS. 9A and 9B, a thickness T4 (in the Z-direction) of the second interfacial layers 242 is less than the thickness T3 of the first interfacial layers 236. In some embodiments, the thickness T4 is about 6 Å to about 15 Å. Thus, the space between the suspended semiconductor layers 210B surrounded by the second interfacial layers 236 in the core area can be enlarged to ensure enough space for later formation of the gate dielectric layer and the gate electrode.

Now referring to FIGS. 1, 10A and 10B, at operation 130, gate dielectric layers 244 are formed around the first interfacial layers 236 in the I/O area and around the second interfacial layers 242 in the core area. In some embodiments, the gate dielectric layers 244 include a high-k dielectric material such as $Si_3N_4$, $SiO_2$, hafnium oxide (HfO), zirconium oxide, lanthanum oxide, titanium oxide, yttrium oxide, strontium titanite, other suitable metal-oxides, or combinations thereof. In some embodiments, the gate dielectric layers 244 are deposited by ALD and/or other suitable methods. In some embodiments, a thickness T5 (in the Z-direction) of the gate dielectric layers 244 is about 15 Å to about 18 Å. The thickness T5 cannot be too thin or too thick. If it is too thin, it might break easily. If it is too thick, it would occupy too much space.

In an IC without extra trimming to the channel semiconductor layers in the I/O area, the channel semiconductor layers are of the same thickness in the core area and the I/O area. Since the interfacial layers are of different thicknesses in different areas, i.e. thicker interfacial layer in the I/O area and thinner interfacial layer in the core area, there is less space between the channel semiconductor layers in the I/O area. Therefore, the high-k dielectric layers formed around the interfacial layers may be merged between the channel semiconductor layers in the I/O area. Thereby, the dipole patterning may be disabled due to the merged high-k dielectric layers in the tight space between the channel semiconductor layers in the I/O area. In addition, there is no space for the gate electrode (including the WFM and/or the bulk metal) to be formed between the channel semiconductor layers in the I/O area, since the space between the channel semiconductor layers are filled up by the merged high-k dielectric layers. Therefore, the desired Vt of the I/O device cannot be achieved, and the performance of the IC is degraded.

However, in the present disclosure, as depicted in FIGS. 10A and 10B, due to the extra trimming to the channel semiconductor layers in the I/O area, the space between the trimmed semiconductor layers 210B' in the I/O area are enlarged, thereby the merging issues of the high-k dielectric layers 244 between the semiconductor layers 210B' in the I/O area is mitigated. Therefore, in the I/O area of the present disclosure, it is possible to perform the dipole patterning (will be discussed later) between the semiconductor layers 210B', and there is enough space for the gate electrode (including the WFM and/or the bulk metal) to be formed between the semiconductor layers 210B' in the following steps. The dipole patterning to the high-k dielectric layer, or the WFM can help to achieve the desired Vt of the devices.

Now referring to FIGS. 1, 11A and 11B, at operation 135, dipole oxide layers 246 are deposited around the gate dielectric layers 244. In some embodiments, the dipole oxide layers 246 are deposited around the high-k dielectric layers 244 of all the devices, including the n-type devices 201N and p-type device 201P in the core area and the n-type devices 202N and p-type device 202P in the I/O area. In some other embodiments, the dipole oxide layers 246 are not deposited around the high-k dielectric layer 244 of the n-type devices 201N and p-type device 201P in the core area, but only the n-type devices 202N and p-type device 202P in the I/O area (devices in the core area may be protected with a hard mask and/or a photoresist layer). In some embodiments, selection of the material of the dipole oxide layer 246 depends on the type of the transistors. For example, a dipole material suitable for n-type devices (also referred to as an n-type dipole material) may include lanthanoid oxide ($La_2O_3$), yttrium oxide ($Y_2O_3$), titanium oxide ($TiO_2$), other n-type dipole material, or combinations thereof; and a dipole material suitable for p-type devices (also referred to as a p-type dipole material) may include aluminum oxide ($Al_2O_3$), $TiO_2$, other p-type dipole material, or combinations thereof. In the depicted embodiment, n-type dipole oxide layers 246 (for example, including $La_2O_3$) are formed over the gate dielectric layers 244. In some embodiments, the dipole oxide layers 246 are conformally deposited around the high-k dielectric layers 244 by an ALD process (i.e., the thickness T6 (in the Z-direction) of the dipole oxide layers 246 is about the same all around). The thickness T6 of the dipole oxide layers 246 is controlled by the ALD processing time. The thickness T6 cannot be too thick or too thin for a proper Vt adjustment according to the design requirement. In some embodiments, the thickness T6 of the dipole oxide layer 246 is about 3 Å to about 10 Å.

Now referring to FIGS. 1, 12A, 12B, 13A and 13B, at operation 140, the dipole oxide layers 246 over the gate dielectric layers 244 in the n-type device 201N and p-type device 201P in the core area, and in the p-type device 202P in the I/O area are removed. Referring to FIG. 12B, first, a hard mask 248 is formed over the n-type device 202N in the I/O area. In some embodiments, the hard mask 248 includes a material such as $Al_2O_3$, TiN, other suitable materials, or combinations thereof. The hard mask 248 may be formed by CVD, PVD, ALD, other deposition process, or combinations thereof. The dipole oxide layers 246 are then removed from the n-type device 201N, p-type device 201P, and the p-type device 202P, while the dipole oxide layers 246 in the n-type device 202N are protected by the hard mask 248 and remain unchanged. In some embodiments, the removing process is an etching process including a dry etch, a wet etch, other etching process, or combinations thereof. Thereafter, referring to FIGS. 13A and 13B, the hard mask 248 is removed to expose the dipole oxide layer 246 in the n-type device 202N in the I/O area.

Now referring to FIGS. 1, 14A and 14B, at operation 145, a dipole oxide thermal drive-in process is performed such that a gate dielectric layer with dipole is formed for the N-type device 202N in the I/O area. In some embodiments, the dipole oxide thermal drive-in process is an annealing process applied to the IC 200. The annealing temperate is about 600° C. to about 900° C. The high temperature makes the metal ions in the dipole oxide layer 246 penetrated into (react with) the gate dielectric layer 244, thus the gate dielectric layer 244 of the n-type device 202N in the I/O area turns into a gate dielectric layer with dipole 250 (also referred to as a dipole gate dielectric layer). The metal ions increase the polarity of the gate dielectric layer, and thus can be used to adjust the Vt of the devices in the I/O area. Any inactive dipole oxide is then removed by an etching process (including dry etching, wet etching, or combinations thereof) with an etchant such as acid (HCl), alkali ($NH_4$), oxidant, other suitable etchant, or combinations thereof.

As discussed above, when the space between the channel semiconductor layers in the I/O area is very tight, the dipole process could not be applied to the portion of the gate (high-k) dielectric layers merged between the channel semiconductor layers, thus using dipole high-k layer to adjust the Vt of the I/O devices is disabled. However, in the present disclosure, the space between the channel semiconductor layers in the I/O area is enlarged due to the extra trimming to the channel semiconductor layers. The entire high-k dielectric layer can be surrounded by the dipole oxide layer, and be dipole patterned. Thereby, the Vt of the I/O devices in the present disclosure can be adjusted by the high-k dielectric layer with dipole.

Now referring to FIGS. 1, 15A, 15B, 16A and 16B, at operation 150, metal gate electrodes are formed to fill the spaces between the trimmed semiconductor layers 210B' of the n-type device 202N and p-type device 202P in the I/O area. Since the n-type device 202N in the I/O area includes the gate dielectric layers with dipole 250, and the p-type device 202P in the I/O area include the gate dielectric layers without dipole 244, there is no need to deposit different WFM materials to the devices 202N and 202P to adjust the different Vt. N-type device 202N and p-type device 202P in the I/O area can share the same metal gate material. In the depicted embodiment, capping metal layers 252 are deposited for the n-type device 202N and p-type device 202P in the I/O area and works as a portion of a gate electrode for these devices. In some embodiments, a material of the capping metal layers 252 includes titanium silicon nitride (TiSiN), tantalum nitride (TaN), titanium nitride (TiN), other proper material, or combinations thereof. Referring to FIGS. 15A and 15B, in some embodiments, the capping metal layers 252 are first deposited to different types of devices in different areas. For example, the capping metal layers 252 are deposited to wrap the gate dielectric layers with dipole 250 of the n-type device 202N and the gate dielectric layer without dipole 244 of the p-type device 202P in the I/O device. The capping metal layers 252 are also deposited to wrap the gate dielectric layers without dipole 244 of the n-type device 201N and the p-type device 201P in the core area. Thereafter, referring to FIGS. 16A and 16B, a hard mask 254 and a photoresist layer 256 are formed to cover the devices 202N and 202P in the I/O area. Therefore, the capping metal layers 252 formed over the devices 201N and 201P in the core area are removed, while the capping metal layers 252 formed over the devices 202N and 202P in the I/O area remain unchanged. The removing process may be a dry etch, a wet etch, other etching process, or combinations thereof.

Now referring to FIGS. 1, 17A, 17B, 18A, 18B, 19A and 19B, at operation 155, different WFM layers are formed for n-type device 201N and p-type device 201P in the core area. As discussed above, in the depicted embodiment, no dipole process is performed to the gate dielectric layers 244 of the devices 201N and 201P in the core area, thus the gate electrodes formed for these devices still need a WFM layer to achieve the different Vt for different types of the devices. Referring to FIGS. 17A and 17B, first WFM layers 258 are formed in the core area to wrap the gate dielectric layers 244 and fill in the spaces between the semiconductor layers 210B of devices 201N and 201P. The materials of the first WFM layers 258 may be different for different types of the devices in the core area. For example, in the depicted embodiment, the first WFM layers 258 are for the n-type device, the material of the first WFM layers 258 may include titanium aluminum (TiAl), titanium aluminum carbide (TiAlC), tantalum aluminum carbide (TaAlC), titanium aluminum nitride (TiAlN) other materials, or combinations thereof. In some embodiments, the first WFM layers 258 may be formed by any suitable method, such as CVD, ALD, PVD, plating, chemical oxidation, thermal oxidation, other suitable methods, or combinations thereof.

Thereafter, referring to FIGS. 18A and 18B, a hard mask 260 and a photoresist layer 262 are formed over the n-type device 201N in the core area. Thereby, the first WFM layers 258 formed in the p-type device 201P in the core area may be removed by any proper etching processing, while the first WFM layers 258 disposed in the n-type deice 201N in the core area and the capping metal layer 252 disposed in the n-type device 202N and the p-type device 202P in the I/O area remain unchanged.

Now referring to FIGS. 19A and 19B, second WFM layers 264 are formed in the p-type device 201P in the core area to fill in the spaces between the semiconductor layers 210B thereof. In the depicted embodiment, the second WFM layers 264 are for the p-type device, the material of the second WFM layers 264 may include TiN, TSN, TaN, tungsten carbonitride (WCN), molybdenum (Mo), other suitable materials, or combinations thereof. In some embodiments, the second WFM layers 264 may be formed by any suitable method, such as CVD, ALD, PVD, plating, chemical oxidation, thermal oxidation, other suitable methods, or combinations thereof.

The operation 155 may also include a step to remove (for example, by etching) the hard masks 254, 260, and the photoresist layers 256, and 262, respectively.

Figures 20A, 20B:
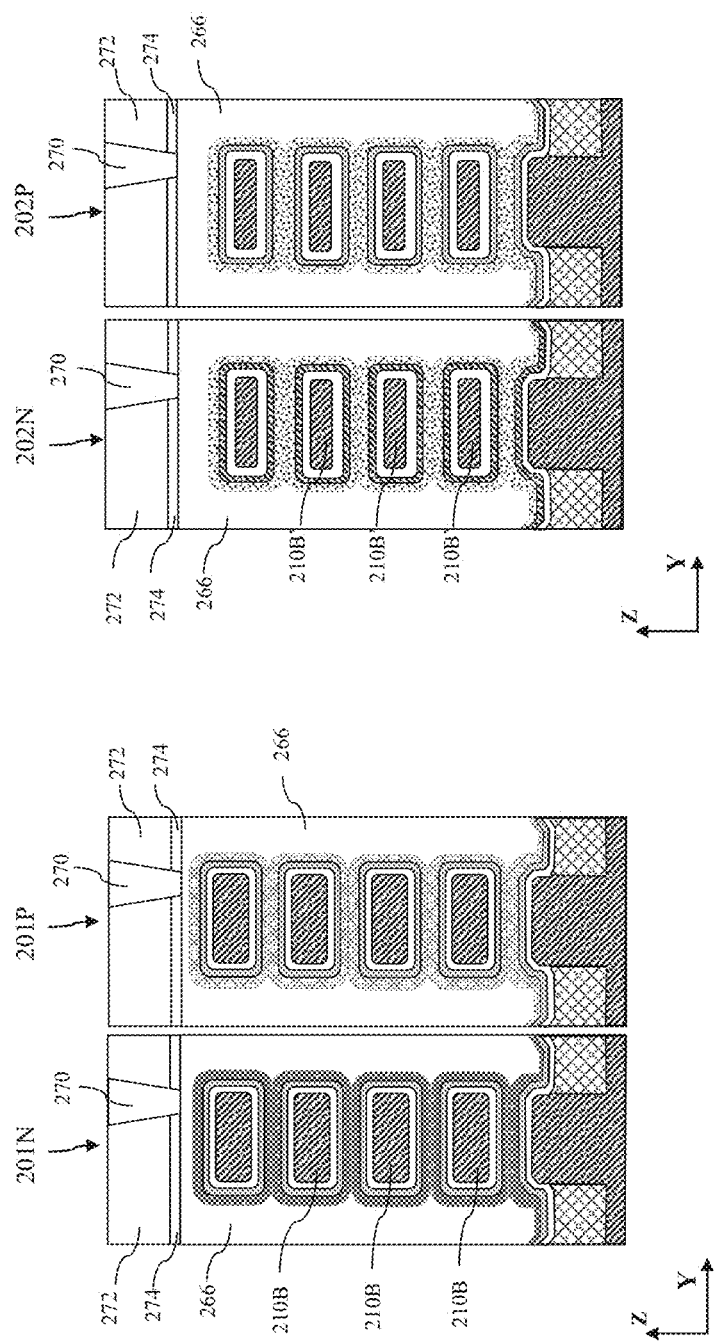

Referring to FIG. 1 and FIGS. 20A and 20B, at operation 160, method 100 performs further processing to complete the fabrication of the IC 200. For example, it may form bulk conductive materials to form a metal fill layer 266 in the channel regions of the devices 201N, 201P, 202N, and 202P. At operation 160, method 100 may also form various contacts/vias 270, metal lines, as well as other multilayer interconnect features such as ILD layers 272 and ESLs 274 over IC 200, configured to connect the various features to form a functional circuit that may include the semiconductor devices.

Although not intended to be limiting, one or more embodiments of the present disclosure provide many benefits to an integrated circuit and a formation process thereof. For example, embodiments of the present disclosure provide IC includes trimmed channel semiconductor layers in the I/O area, such that the channel semiconductor layers in the I/O area is thinner than the channel semiconductor layers in the core are, therefore the space between the trimmed channel semiconductor layers in the I/O area is larger than the space between the channel semiconductor layers in the core area. Thereby, even though the interfacial layer in the I/O area is thicker than in the core area, the merging issues of the high-k dielectric layers in the I/O area can be mitigated. In addition, in the I/O area, the high-k dielectric layer can be completely dipole patterned, thereby it can provide different Vt for different type (n-type or p-type) of devices even though the different type devices may have the same gate electrode material.

The present disclosure provides for many different embodiments. Semiconductor device having trimmed channel and dipoled dielectric layer and methods of fabrication thereof are disclosed herein. A method of forming a semiconductor device comprises forming a first stack structure and a second stack structure in a first area over a substrate, wherein each of the first stack structure and the second stack structure includes semiconductor layers separated from each other and stacked up along a direction generally perpendicular to a top surface of the substrate; depositing a first interfacial layer around each of the semiconductor layers of the first stack structure and the second stack structure; depositing a gate dielectric layer around the first interfacial layer of the first stack structure and the second stack structure; forming a dipole oxide layer around the gate dielectric layer of the first stack structure and the second stack structure; removing the dipole oxide layer around the gate dielectric layer of the second stack structure; performing an annealing process to the semiconductor device to form a dipole gate dielectric layer for the first stack structure and a non-dipole gate dielectric layer for the second stack structure; and depositing a first gate electrode around the dipole gate dielectric layer of the first stack structure and the non-dipole gate dielectric layer of the second stack structure.

In some embodiments, the exemplary method further comprises forming a third stack structure and a fourth stack structure in a second area over the substrate, wherein each of the third stack structure and the fourth stack structure includes semiconductor layers separated from each other and stacked up along the direction generally perpendicular to the top surface of the substrate; forming a second interfacial layer around each of the semiconductor layers of the third stack structure and the fourth stack structure, wherein a thickness of the second interfacial layer is less than a thickness of the first interfacial layer; depositing the gate dielectric layer around the second interfacial layer of the third stack structure and the fourth stack structure; depositing a second gate electrode around the gate dielectric layer of the third stack structure, wherein a material of the second gate electrode is different than a material of the first gate electrode; and depositing a third gate electrode around the gate dielectric layer of the fourth stack structure, where a material of the third gate electrode is different than the material of the second gate electrode and the material of the first gate electrode.

In some embodiments, the exemplary method further comprises trimming the semiconductor layers of the first stack structure and the second stack structure to reduce the thickness of the semiconductor layers of the first stack structure and the second stack structure before depositing the first interfacial layer around each of the semiconductor layers of the first stack structure and the second stack structure. In some embodiments, trimming of the semiconductor layers of the first stack structure and the second stack structure includes reducing thicknesses of the semiconductor layers of the first stack structure and the second stack structure by about 5% to about 30%.

In some embodiments, depositing the first gate electrode including depositing the same conductive material around the dipole gate dielectric layer of the first stack structure and the non-dipole gate dielectric layer of the second stack structure. In some embodiments, the first interfacial layer is deposited for about 12 angstrom (Å) to about 31 Å.

Another exemplary method comprises forming semiconductor layers in an I/O area of a substrate, wherein the semiconductor layers in the I/O area are separated from each other and are stacked up along a direction generally perpendicular to a top surface of the substrate; forming semiconductor layers in a core area of the substrate, wherein the semiconductor layers in the core area are separated from each other and are stacked up along the direction generally perpendicular to the top surface of the substrate; depositing a first interfacial layer around each of the semiconductor layers in the I/O area; forming a second interfacial layer around each of the semiconductor layers in the core area; depositing a first gate dielectric layer around the first interfacial layer; depositing a second gate dielectric layer around the second interfacial layer; depositing a dipole oxide layer around the first gate dielectric layer; performing an annealing process to the dipole oxide layer to form a dipole gate dielectric layer around the first interfacial layer; depositing a first gate electrode around the dipole gate dielectric layer; and depositing a second gate electrode around the second gate dielectric layer.

In some embodiments, the exemplary method further comprises before depositing the first interfacial layer around each of the semiconductor layers depositing a hard mask over the semiconductor layers in the core area; trimming the semiconductor layers in the I/O area; and removing the hard mask over the semiconductor layers in the core area. In some embodiments, trimming the semiconductor layers in the I/O area includes performing an oxidation process to the semiconductor layers in the I/O area to form oxidized surfaces of the semiconductor layers in the I/O area; and etching the oxidized surfaces of the semiconductor layers in the I/O area.

In some embodiments, the exemplary method further comprises depositing the dipole oxide layer around the second gate dielectric layer; depositing a hard mask over the dipole oxide layer around the first gate dielectric layer; removing the dipole oxide layer around the second gate dielectric layer; and removing the hard mask over the dipole oxide layer around the first gate dielectric layer.

In some embodiments, a thickness of the first interfacial layer is greater than a thickness of the second interfacial layer. In some embodiments, a thickness of the dipole oxide layer is about 0.3 nanometer (nm) to about 1 nm.

An exemplary semiconductor device comprises a substrate; first semiconductor layers over a first area of the substrate, wherein the first semiconductor layers are separated from each other and are stacked up along a direction generally perpendicular to a top surface of the substrate; a first interfacial layer around each of the first semiconductor layers; a gate dielectric layer with dipole around the first interfacial layer; and a first gate electrode around the gate dielectric layer with dipole.

In some embodiments, the exemplary semiconductor device further comprises second semiconductor layers over the first area of the substrate, wherein the second semiconductor layers are separated from each other and are stacked up along the direction generally perpendicular to the top surface of the substrate; a second interfacial layer around each of the second semiconductor layers; a gate dielectric layer without dipole around the second interfacial layer; and a second gate electrode around the gate dielectric layer without dipole around the second interfacial layer, wherein a material of the second gate electrode is the same as a material of the first gate electrode.

In some embodiments, the exemplary semiconductor device further comprises third semiconductor layers over a second area of the substrate, wherein the third semiconductor layers are separated from each other and are stacked up along the direction generally perpendicular to the top surface of the substrate, further wherein a thickness of each of the third semiconductor layers is greater than a thickness of each of the first semiconductor layers; a third interfacial layer around each of the third semiconductor layers; a gate dielectric layer without dipole around the third interfacial layer; and a third gate electrode around the gate dielectric layer without dipole around the third interfacial layer.

In some embodiments, the thickness of the first semiconductor layer is less than the thickness of the third semiconductor layer for more than about 1 nm. In some embodiments, a thickness of the first interfacial layer is less than a thickness of the third interfacial layer. In some embodiments, a thickness of the first interfacial layer is about 12 angstrom (Å) to about 31 Å.

In some embodiments, a distance between top surfaces of adjacent first semiconductor layers is substantially equal to a distance between top surfaces of adjacent third semiconductor layers. In some embodiments, a material of the third gate electrode is different than a material of the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a first stack structure and a second stack structure in a first area over a substrate, wherein each of the first stack structure and the second stack structure includes semiconductor layers separated from each other and stacked up along a direction generally perpendicular to a top surface of the substrate;
   depositing a first interfacial layer around each of the semiconductor layers of the first stack structure and the second stack structure;
   depositing a gate dielectric layer around the first interfacial layer of the first stack structure and the second stack structure;
   forming a dipole oxide layer around the gate dielectric layer of the first stack structure and the second stack structure;
   removing the dipole oxide layer around the gate dielectric layer of the second stack structure;
   performing an annealing process to the semiconductor device to form a dipole gate dielectric layer for the first stack structure and a non-dipole gate dielectric layer for the second stack structure;
   depositing a first gate electrode around the dipole gate dielectric layer of the first stack structure and the non-dipole gate dielectric layer of the second stack structure, wherein depositing the first gate electrode includes depositing the same conductive material directly on the dipole gate dielectric layer of the first stack structure and the non-dipole gate dielectric layer of the second stack structure such that the same conductive material interfaces with the dipole gate dielectric layer of the first stack structure and the non-dipole gate dielectric layer of the second stack structure;
   forming a metal fill layer on the same conductive material disposed directly on the dipole gate dielectric layer of the first stack structure and the non-dipole gate dielectric layer of the second stack structure;

forming a third stack structure in a second area over the substrate, wherein the third stack structure includes semiconductor layers separated from each other and stacked up along the direction generally perpendicular to the top surface of the substrate;

forming a protective layer around each of the semiconductor layers of the third stack; and trimming the semiconductor layers of the first stack structure to reduce a thickness of each the semiconductor layers of the first stack structure prior to depositing the first interfacial layer around each of the semiconductor layers of the first stack structure and the second stack structure.

2. The method of claim 1, wherein the forming of the third stack structure in the second area over the substrate includes forming a fourth stack structure in the second area over the substrate, wherein the fourth stack structure includes semiconductor layers separated from each other and stacked up along the direction generally perpendicular to the top surface of the substrate, the method further comprising:

forming a second interfacial layer around each of the semiconductor layers of the third stack structure and the fourth stack structure, wherein a thickness of the second interfacial layer is less than a thickness of the first interfacial layer;

depositing the gate dielectric layer around the second interfacial layer of the third stack structure and the fourth stack structure;

depositing a second gate electrode around the gate dielectric layer of the third stack structure, wherein a material of the second gate electrode is different than a material of the first gate electrode; and depositing a third gate electrode around the gate dielectric layer of the fourth stack structure, where a material of the third gate electrode is different than the material of the second gate electrode and the material of the first gate electrode.

3. The method of claim 2, wherein the trimming of the semiconductor layers of the first stack structure to reduce the thickness of each the semiconductor layers of the first stack includes trimming the semiconductor layers of the second stack structure to reduce a thickness of the semiconductor layers of the second stack structure before depositing the first interfacial layer around each of the semiconductor layers of the first stack structure and the second stack structure.

4. The method of claim 3, wherein the trimming of the semiconductor layers of the first stack structure and the second stack structure includes reducing thicknesses of the semiconductor layers of the first stack structure and the second stack structure by about 5% to about 30%.

5. The method of claim 1, wherein the first interfacial layer is deposited for about 12 angstrom (Å) to about 31 Å.

6. The method of claim 1, further comprising forming a first contact interfacing with the metal fill layer, wherein the same conductive material is disposed directly on the dipole gate dielectric layer of the first stack structure and the non-dipole gate dielectric layer of the second stack structure during the forming of the first contact, and wherein the first stack structure is associated with a first transistor having a first-type of conductivity and the second stack structure is associated with a second transistor having a second-type of conductivity that is opposite the first-type of conductivity.

7. The method of claim 1, wherein the first area of the substrate includes an I/O area.

8. A method of forming a semiconductor device, comprising:

forming semiconductor layers in an I/O area of a substrate, wherein the semiconductor layers in the I/O area are separated from each other and are stacked up along a direction generally perpendicular to a top surface of the substrate;

forming semiconductor layers in a core area of the substrate, wherein the semiconductor layers in the core area are separated from each other and are stacked up along the direction generally perpendicular to the top surface of the substrate;

depositing a first interfacial layer around each of the semiconductor layers in the I/O area;

forming a second interfacial layer around each of the semiconductor layers in the core area;

depositing a first gate dielectric layer around the first interfacial layer;

depositing a second gate dielectric layer around the second interfacial layer;

depositing a dipole oxide layer around the first gate dielectric layer;

performing an annealing process to the dipole oxide layer to form a dipole gate dielectric layer around the first interfacial layer;

depositing a first gate electrode around the dipole gate dielectric layer;

depositing a second gate electrode around the second gate dielectric layer; and before depositing the first interfacial layer around each of the semiconductor layers:

depositing a hard mask over the semiconductor layers in the core area;

trimming the semiconductor layers in the I/O area; and removing the hard mask over the semiconductor layers in the core area.

9. The method of claim 8, wherein trimming the semiconductor layers in the I/O area includes:

performing an oxidation process to the semiconductor layers in the I/O area to form oxidized surfaces of the semiconductor layers in the I/O area; and etching the oxidized surfaces of the semiconductor layers in the I/O area.

10. The method of claim 8, further comprising:

depositing the dipole oxide layer around the second gate dielectric layer;

depositing a hard mask over the dipole oxide layer around the first gate dielectric layer;

removing the dipole oxide layer around the second gate dielectric layer; and removing the hard mask over the dipole oxide layer around the first gate dielectric layer.

11. The method of claim 8, wherein a thickness of the first interfacial layer is greater than a thickness of the second interfacial layer.

12. The method of claim 8, wherein a thickness of the dipole oxide layer is about 0.3 nanometer (nm) to about 1 nm.

13. A method comprising:

forming a first set of first semiconductor layers over a substrate, wherein each of the first semiconductor layers is separated from each other, the first set of first semiconductor layers extending vertically upward away from the substrate;

forming a second set of second semiconductor layers over the substrate, wherein each of the second semiconductor layers is separated from each other, the second set of second semiconductor layers extending vertically upward away from the substrate;

forming a first interfacial layer having a first thickness around each of the first semiconductor layers of the first set;

forming a second interfacial layer having a second thickness around each of the second semiconductor layers of the second set, the second thickness being different than the first thickness;

forming a first gate dielectric layer around each of the first semiconductor layers of the first set and around each of the second semiconductor layers of the second set, wherein the first interfacial layer is disposed between each of the first semiconductor layers and the first gate dielectric layer and the second interfacial layer is disposed between each of the second semiconductor layers and the first gate dielectric layer after the forming of the first gate dielectric layer around each of the first semiconductor layers of the first set and around each of the second semiconductor layers of the second set;

forming a dipole oxide layer around each of the first semiconductor layers of the first set and around each of the second semiconductor layers of the second set;

removing the dipole oxide layer from around each of the first semiconductor layers of the first set;

performing an annealing process on the dipole oxide layer disposed around each of the second semiconductor layers of the second set to form a dipole gate dielectric layer around each of the second semiconductor layers of the second set;

forming a first work function metal layer around each of the first semiconductor layers of the first set and around the dipole gate dielectric layer disposed around each of the second semiconductor layers of the second set;

forming a protective layer around each of the first semiconductor layers; and trimming the second semiconductor layers to reduce a thickness of each the second semiconductor layers prior to forming the first and second interfacial layers.

14. The method of claim 13, further comprising:
removing the first work function metal layer around each of the first semiconductor layers of the first set; and
forming a second work function metal layer around each of the first semiconductor layers of the first set.

15. The method of claim 14, further comprising:
removing the second work function metal layer around each of the first semiconductor layers of the first set; and
forming a third work function metal layer around each of the first semiconductor layers of the first set.

16. The method of claim 14, further comprising forming a metal fill layer around the first and second work function metal layers.

17. The method of claim 13, wherein the first semiconductor layers are formed of the same material as the second semiconductor layers.

18. The method of claim 13, wherein forming the second set of second semiconductor layers over the substrate includes forming a third set of third semiconductor layers over the substrate, wherein each of the third semiconductor layers is separated from each other, the third set of second semiconductor layers extending vertically upward away from the substrate;

wherein forming the second interfacial layer having the second thickness around each of the second semiconductor layers of the second set includes forming the second interfacial layer having the second thickness around each of the third semiconductor layers of the third set, wherein forming the first gate dielectric layer around each of the first semiconductor layers of the first set and around each of the second semiconductor layers of the second set includes forming the first gate dielectric layer around each of the third semiconductor layers of the third set, wherein forming the dipole oxide layer around each of the first semiconductor layers of the first set and around each of the second semiconductor layers of the second set includes forming the dipole oxide layer around each of the third semiconductor layers of the third set, wherein removing the dipole oxide layer from around each of the first semiconductor layers of the first set includes removing the dipole oxide layer from around each of the third semiconductor layers, and wherein forming the first work function metal layer around each of the first semiconductor layers of the first set and around the dipole gate dielectric layer disposed around each of the second semiconductor layers of the second set includes forming the first work function metal layer around each of the third semiconductor layers.

19. The method of claim 18, further comprising forming a metal fill layer on the first work function metal layer around the dipole gate dielectric layer disposed around each of the second semiconductor layers of the second set and on the first work function metal layer disposed around each of the third semiconductor layers.

20. The method of claim 13, wherein the dipole oxide layer disposed around each of the second semiconductor layers is exposed during the performing of the annealing process.

* * * * *